(12) United States Patent
Nakasugi et al.

(10) Patent No.: US 7,889,910 B2
(45) Date of Patent: Feb. 15, 2011

(54) CHARACTER PATTERN EXTRACTING METHOD, CHARGED PARTICLE BEAM DRAWING METHOD, AND CHARACTER PATTERN EXTRACTING PROGRAM

(75) Inventors: Tetsuro Nakasugi, Yokohama (JP); Takumi Ota, Yokohama (JP); Takeshi Koshiba, Yokohama (JP); Noriaki Sasaki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 956 days.

(21) Appl. No.: 11/797,531

(22) Filed: May 4, 2007

(65) Prior Publication Data
US 2007/0263921 A1 Nov. 15, 2007

(30) Foreign Application Priority Data
May 12, 2006 (JP) .............................. 2006-134395

(51) Int. Cl.
*G06K 9/00* (2006.01)
(52) U.S. Cl. ....................................... 382/145
(58) Field of Classification Search ................. 382/145
See application file for complete search history.

(56) References Cited

U.S. PATENT DOCUMENTS 6,897,454 B2 5/2005 Sasaki et al.
7,102,147 B2 9/2006 Inanami et al.
2004/0011966 A1* 1/2004 Sasaki et al. ............. 250/492.1
2006/0097191 A1 5/2006 Mizuno

FOREIGN PATENT DOCUMENTS

JP 7-307262 11/1995

* cited by examiner

*Primary Examiner*—Vu Le
*Assistant Examiner*—Michael Vanchy, Jr.
(74) *Attorney, Agent, or Firm*—Finnegan, Henderson, Farabow, Garrett & Dunner, L.L.P.

(57) ABSTRACT

A character pattern extracting method includes ranking character patterns whose number is larger than a maximum number of character patterns in an aperture, depending on the number of reference times in design data of a semiconductor device, extracting first extraction patterns whose number is smaller than the maximum number from the large number of read character patterns in a descending order of the reference time number, defining character patterns except the first extraction patterns out of the larger number of character patterns as candidate patterns, selecting from the candidate patterns a plurality of candidate patterns whose number corresponds to a difference between the number of extracted patterns from the maximum number, and creating combinations of the selected candidate patterns, and extracting second extraction patterns included in a combination among the combinations of candidate patterns, in which a manufacturing time of the semiconductor device is most shortened.

20 Claims, 19 Drawing Sheets

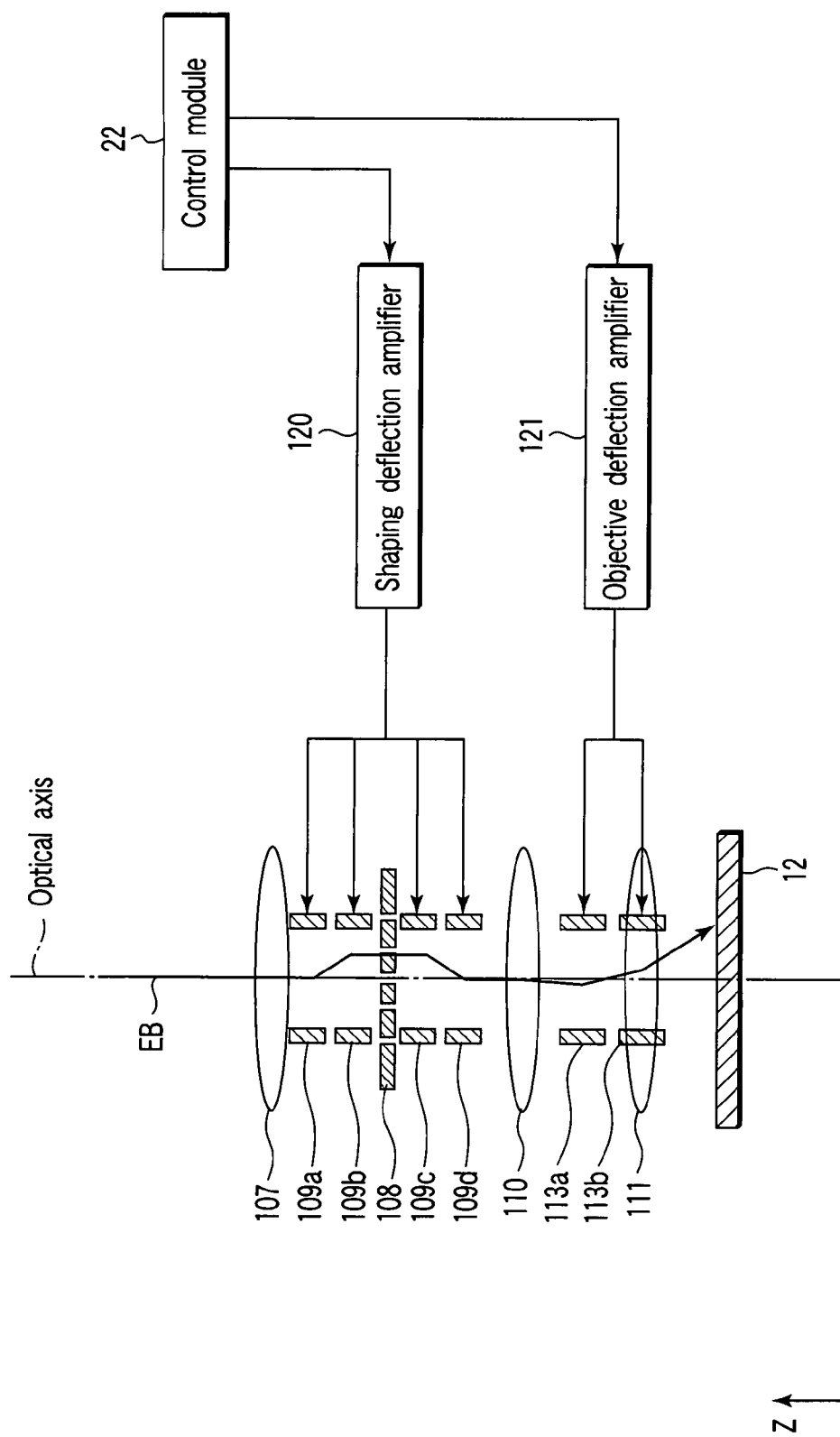
F I G. 4

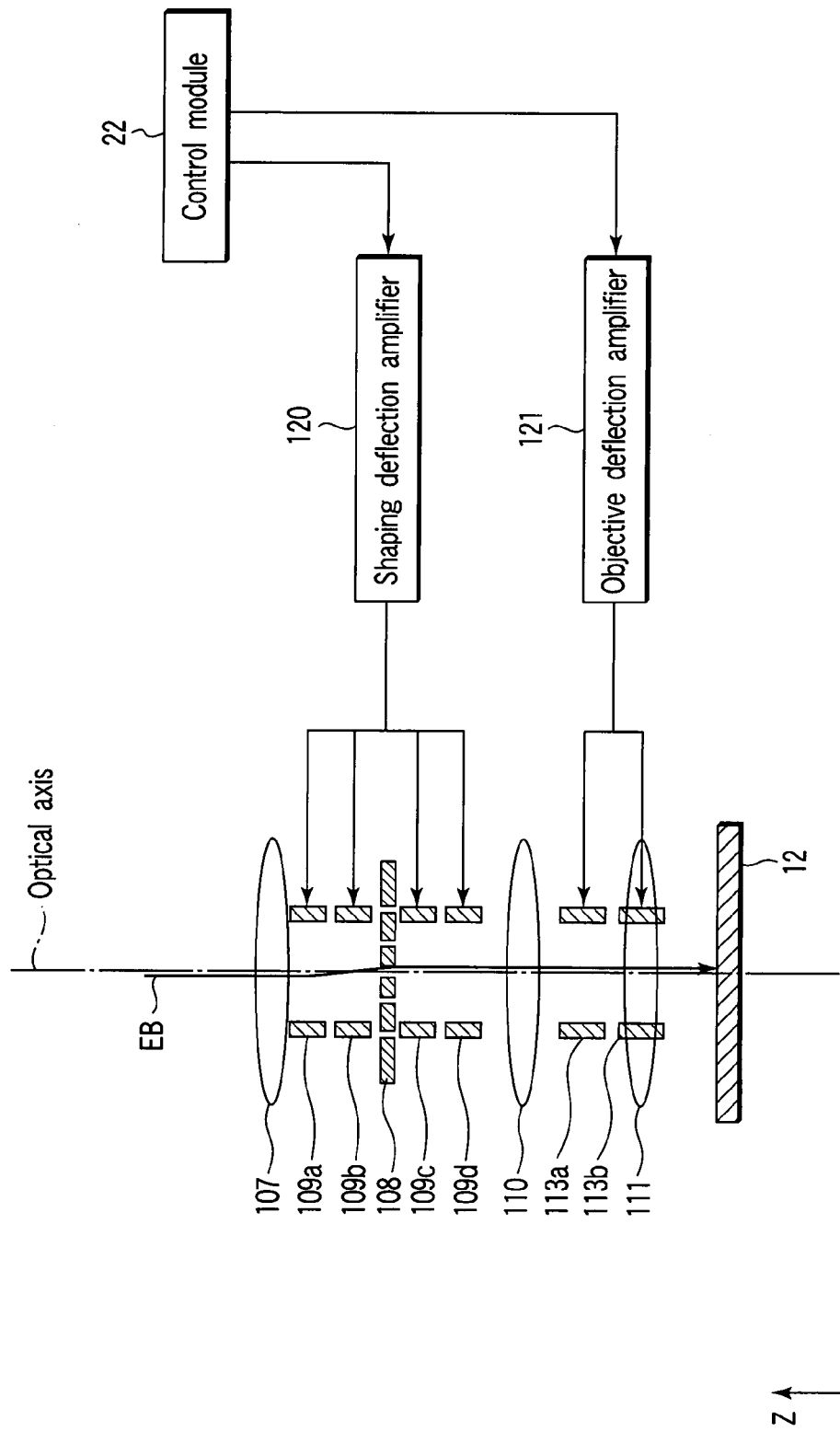
F I G. 5

| Ranking order | Identification number | Number of times of reference "A" | Number of graphics "B" | A*B |
|---|---|---|---|---|
| 1 | 101 | 1000 | 10 | 10000 |
| 2 | 90 | 900 | 11 | 9900 |
| 3 | 205 | 700 | 10 | 7000 |
| ⋮ | ⋮ | | | |
| 50 | 12 | 200 | 10 | 2000 |
| 51 | 7 | 100 | 10 | 1000 |
| ⋮ | | | | |
| 59 | 309 | 11 | 20 | 220 |
| 60 | 186 | 10 | 20 | 200 |

221: First sample area
222: Second sample area
223: Third sample area
224: j-1th sample area
225: jth sample area 231: First sample area
232: Second sample area
233: Third sample area
234: j-1th sample area
235: jth sample area

CHARACTER PATTERN EXTRACTING METHOD, CHARGED PARTICLE BEAM DRAWING METHOD, AND CHARACTER PATTERN EXTRACTING PROGRAM

CROSS-REFERENCE TO RELATED APPLICATIONS

This application is based upon and claims the benefit of priority from prior Japanese Patent Application No. 2006-134395, filed May 12, 2006, the entire contents of which are incorporated herein by reference.

BACKGROUND OF THE INVENTION

1. Field of the Invention

The present invention relates to a technique for manufacturing a semiconductor device, and in particular, to a character pattern extracting method, a charged particle beam drawing method, and a character pattern extracting program.

2. Description of the Related Art

In a charged particle beam drawing method, a variable shaping beam (VSB) scheme which draws a circuit pattern on a resist film by a rectangular beam shaped by using two apertures is a mainstream scheme. In contrast to this, a character projection (CP) scheme is examined which draws a circuit pattern on a resist film by a beam shaped by using a CP aperture. The CP aperture is provided with a character pattern that is similar to some of circuit patterns to be manufactured. A large number of character patterns are formed in the CP aperture to make it possible to shorten drawing time of a circuit pattern. However, the number of character patterns which can be formed in the CP aperture is limited.

Therefore, in a prior art, a plurality of character patterns are prepared, a maximum number of character patterns which can be formed in a CP aperture are selected from the number of prepared character patterns, and a plurality of combinations of the selected maximum number of character patterns are created. Furthermore, the drawing time of a circuit pattern when the plurality of combinations are created in a CP aperture is predicted, and a character pattern included in a combination the drawing time of which is shortest is set in an actual CP aperture (see, for example, Jpn. Pat. Appln. KOKAI Publication No. 7-307262). However, a long time is required to predict the drawing times of the plurality of combinations selected from all the character patterns. Consequently, the time for designing a CP aperture becomes disadvantageously long.

BRIEF SUMMARY OF THE INVENTION

According to one aspect of the present invention, there is provided a character pattern extracting method comprising:

ranking character patterns the number of which is larger than a maximum number of character patterns which are formed in an aperture by a ranking unit depending on the number of times of reference in design data of a semiconductor device to store the character patterns in a ranking storage unit;

reading the larger number of character patterns from the ranking storage unit and extracting a plurality of first extraction patterns the number of which is smaller than the maximum number by a first extracting unit from the large number of read character patterns in a descending order of the number of times of reference;

defining a plurality of character patterns except the first extraction patterns out of the large number of character patterns by the first extracting unit as candidate patterns to store the candidate patterns in a candidate storage unit;

reading the plurality of candidate patterns from the candidate storage unit, selecting from the read candidate patterns a plurality of candidate patterns the number of which corresponds to a difference obtained by subtracting the number of extracted patterns from the maximum number, and creating a plurality of combinations of the plurality of selected candidate patterns by a combination unit to store the combinations of the plurality of selected candidate patterns in a combination storage unit; and reading the plurality of combinations of selected candidate patterns from the combination storage unit and extracting a plurality of second extraction patterns included in a combination among the plurality of combinations of selected candidate patterns by a second extracting unit, in which a manufacturing time of the semiconductor device is most shortened.

According to another aspect of the present invention, there is provided a charged particle beam drawing method comprising:

ranking character patterns the number of which is larger than a maximum number of character patterns which are formed in an aperture depending on the number of times of reference in design data of a semiconductor device;

extracting a plurality of first extraction patterns the number of which is smaller than the maximum number from the larger number of character patterns in a descending order of the number of times of reference;

defining a plurality of character patterns except the first extraction patterns out of the larger number of character patterns as candidate patterns;

selecting from the plurality of candidate patterns a plurality of candidate patterns the number of which corresponds to a difference obtained by subtracting the number of extracted patterns from the maximum number, and creating a plurality of combinations of the plurality of selected candidate patterns;

extracting a plurality of second extraction patterns included in a combination among the plurality of combinations of the selected candidate patterns, in which a manufacturing time of the semiconductor device is most shortened;

manufacturing an aperture having the first extraction patterns and the second extraction patterns; and irradiating a charged particle beam on a resist film by using the aperture.

According to a further aspect of the present invention, there is provided a character pattern extracting program which causes a computer to execute:

ranking character patterns the number of which is larger than a maximum number of character patterns which are formed in an aperture depending on the number of times of reference in design data of a semiconductor device;

extracting a plurality of first extraction patterns the number of which is smaller than the maximum number from the larger number of character patterns in a descending order of the number of times of reference;

defining a plurality of character patterns except the first extraction patterns out of the larger number of character patterns as candidate patterns;

selecting from the plurality of candidate patterns a plurality of candidate patterns the number of which corresponds to a difference obtained by subtracting the number of extracted patterns from the maximum number, and creating a plurality of combinations of the plurality of selected candidate patterns; and extracting a plurality of second extraction patterns included in a combination among the plurality of combinations of the selected candidate pattern, in which a manufacturing time of the semiconductor device is most shortened.

BRIEF DESCRIPTION OF THE SEVERAL VIEWS OF THE DRAWING

FIG. 4 is a first pattern diagram showing a charged particle beam irradiation mechanism of the charged particle beam drawing apparatus according to the first embodiment of the invention;

FIG. 5 is a second pattern diagram showing the charged particle beam irradiation mechanism of the charged particle beam drawing apparatus according to the first embodiment of the invention;

DETAILED DESCRIPTION OF THE INVENTION

Figure 1:
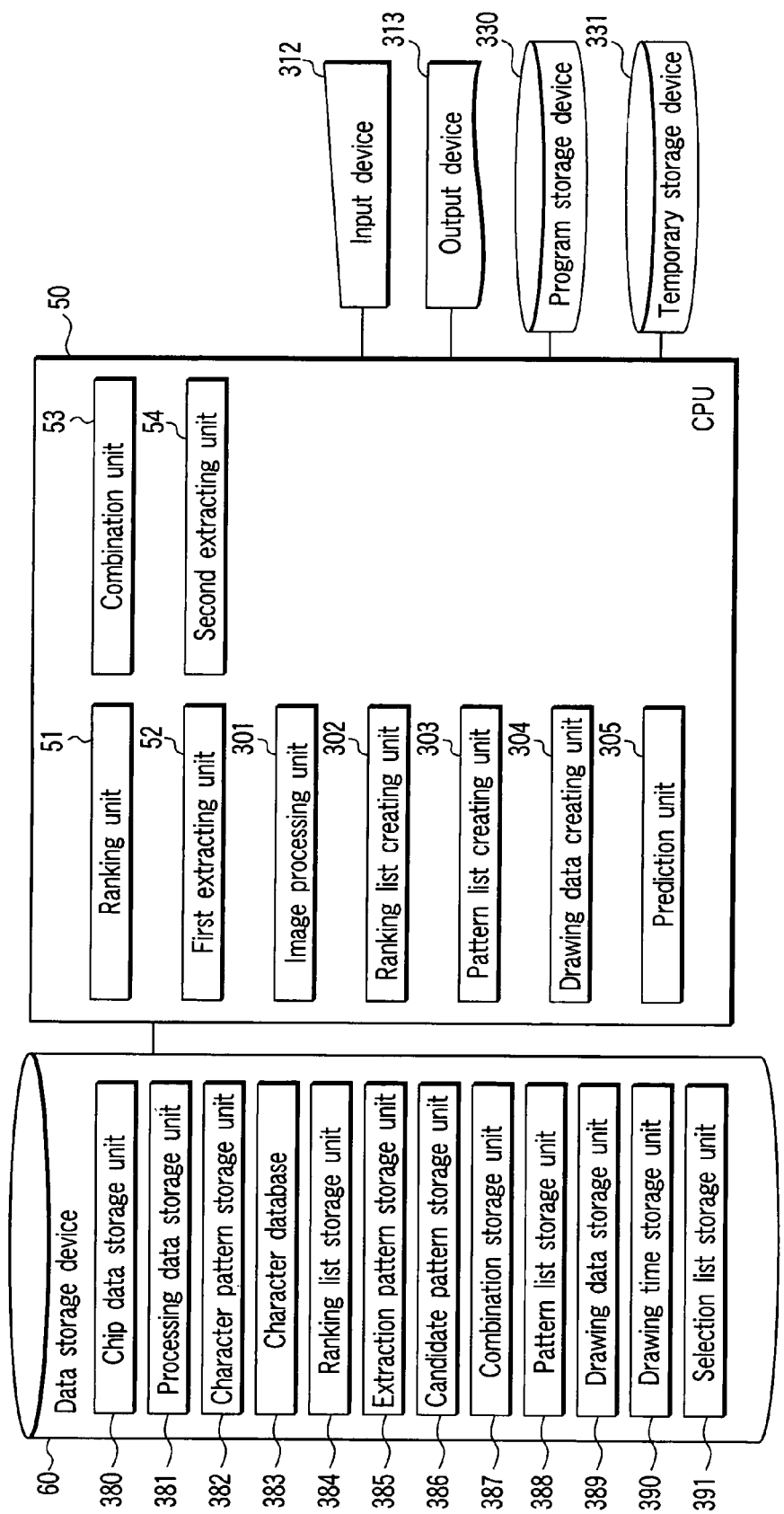
FIG. 1 is a block diagram showing a character pattern extracting system according to a first embodiment of the present invention.

Embodiments of the present invention will be described below with reference to the accompanying drawings. The same reference numerals or similar reference numerals as in the following description of the drawings denote the same parts or similar parts in the drawings.

First Embodiment

Figure 2:
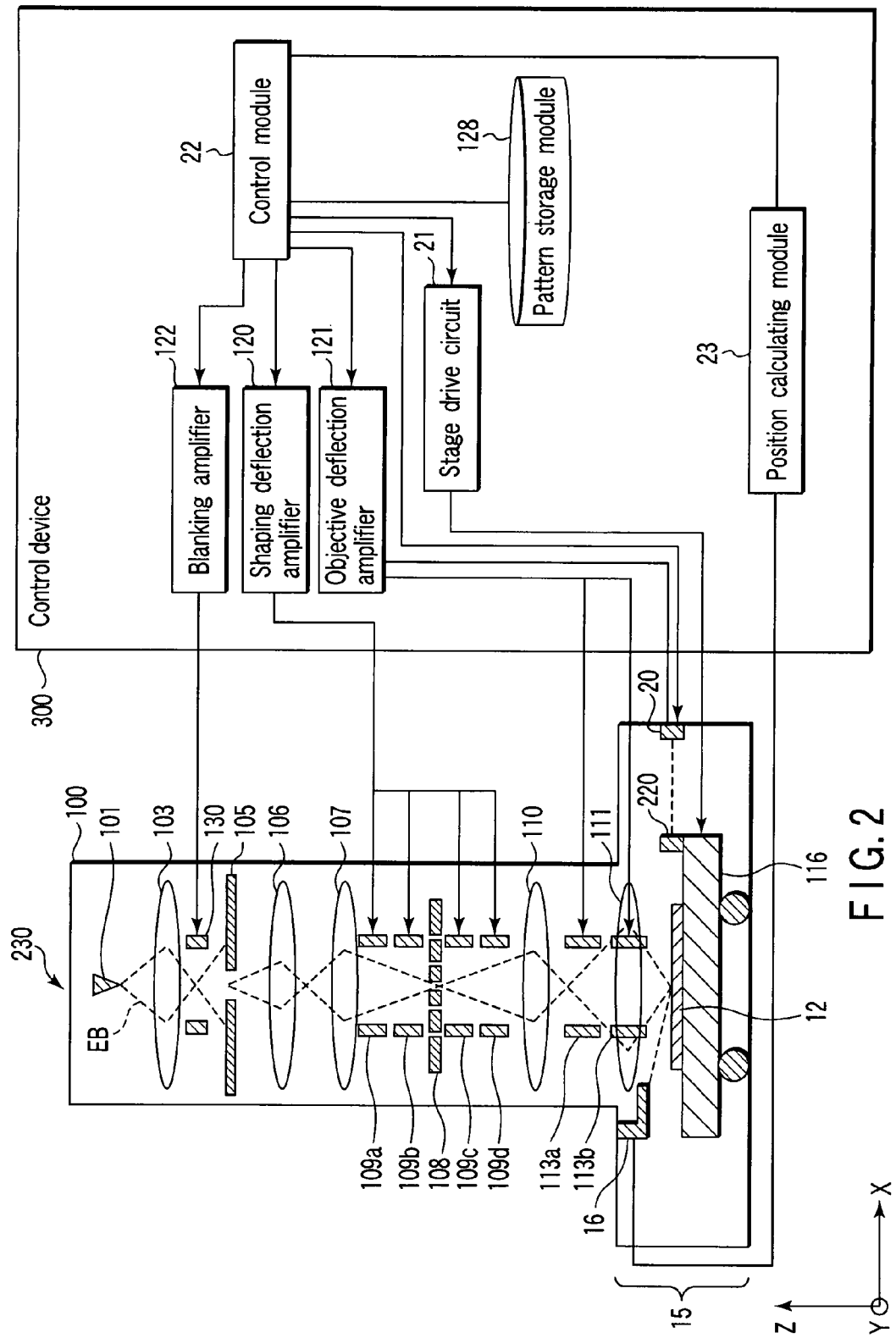
FIG. 2 is a pattern diagram showing a charged particle beam drawing apparatus according to the first embodiment of the invention.

A character pattern extracting system shown in FIG. 1 according to a first embodiment of the present invention is a system which extracts a plurality of character patterns formed in a CP aperture 108 arranged in a charged particle beam drawing apparatus shown in FIG. 2. First, the charged particle beam drawing apparatus shown in FIG. 2 will be described. The charged particle beam drawing apparatus, as shown in FIG. 2, has a charged particle beam irradiation mechanism 230 protected by a column 100 and a control device 300 connected to the charged particle beam irradiation mechanism 230. The charged particle beam irradiation mechanism 230 has an electron gun assembly which emits a charge particle beam such as an electron beam EB. An acceleration voltage applied to the electron gun assembly 101 is, for example, 5 keV. A condenser lens 103 is arranged under the electron gun assembly 101. The electron beam EB transmits through the condenser lens 103 to adjust a current density and a Kaehler illumination condition of the electron beam EB. A shaping aperture 105 is arranged below the condenser lens 103. The shaping aperture 105 shapes the electron beam EB into, for example, a rectangular shape. A first projection lens 106 and a second projection lens 107 are arranged below the shaping aperture 105. Furthermore, a CP aperture 108 is arranged below the second projection lens 107. An image of the shaping aperture 105 formed by irradiating the electron beam EB is focused on the CP aperture 108 by the first projection lens 106 and the second projection lens 107. The CP aperture 108 shapes the electron beam EB into a shape of a character pattern. A reducing lens 110 and an objective lens 111 are arranged below the CP aperture 108. The electron beam EB is transmitted through the reducing lens 110 and the objective lens 111 to reduce the size of the electron beam EB to, for example, 1/5. A wafer 12 on which a resist film to be exposed by the electron beam EB is spin-coated is arranged below the objective lens 111. The resist film is composed of photoresist or the like. The electron beam EB the size of which is reduced by the reducing lens 110 and the objective lens 111 is focused on the surface of the resist film on the wafer 12.

A blanking electrode 130 is arranged between the condenser lens 103 and the shaping aperture 105. In the case of stopping irradiation of the electron beam EB onto the resist film on the wafer 12, the blanking electrode 130 deflects the electron beam EB having transmitted through the condenser lens 103 to a non-opening portion of the shaping aperture 105 to prevent the electron beam EB from reaching the resist film on the wafer 12. When the irradiation of the electron beam EB onto the resist film on the wafer 12 is stopped by the blanking electrode 130 and the shaping aperture 105, the irradiation time of the electron beam EB focused on the resist film on the wafer 12 is adjusted, and the dose of the electron beam EB at the focal point is adjusted. Shaping deflectors 109a and 109b are arranged between the first projection lens 106 and the CP aperture 108. The shaping deflectors 109a and 109b deflect the electron beam EB having been transmitted through the second projection lens 107 to control the irradiation position of the electron beam EB on the CP aperture 108. Shaping deflectors 109c and 109d are arranged below the CP aperture 108. The shaping deflectors 109c and 109d deflect the electron beam EB having transmitted through the CP aperture 108 such that the traveling direction of the electron beam EB having been transmitted through the CP aperture 108 is parallel to the optical axis of the reducing lens 110.

Figure 3:
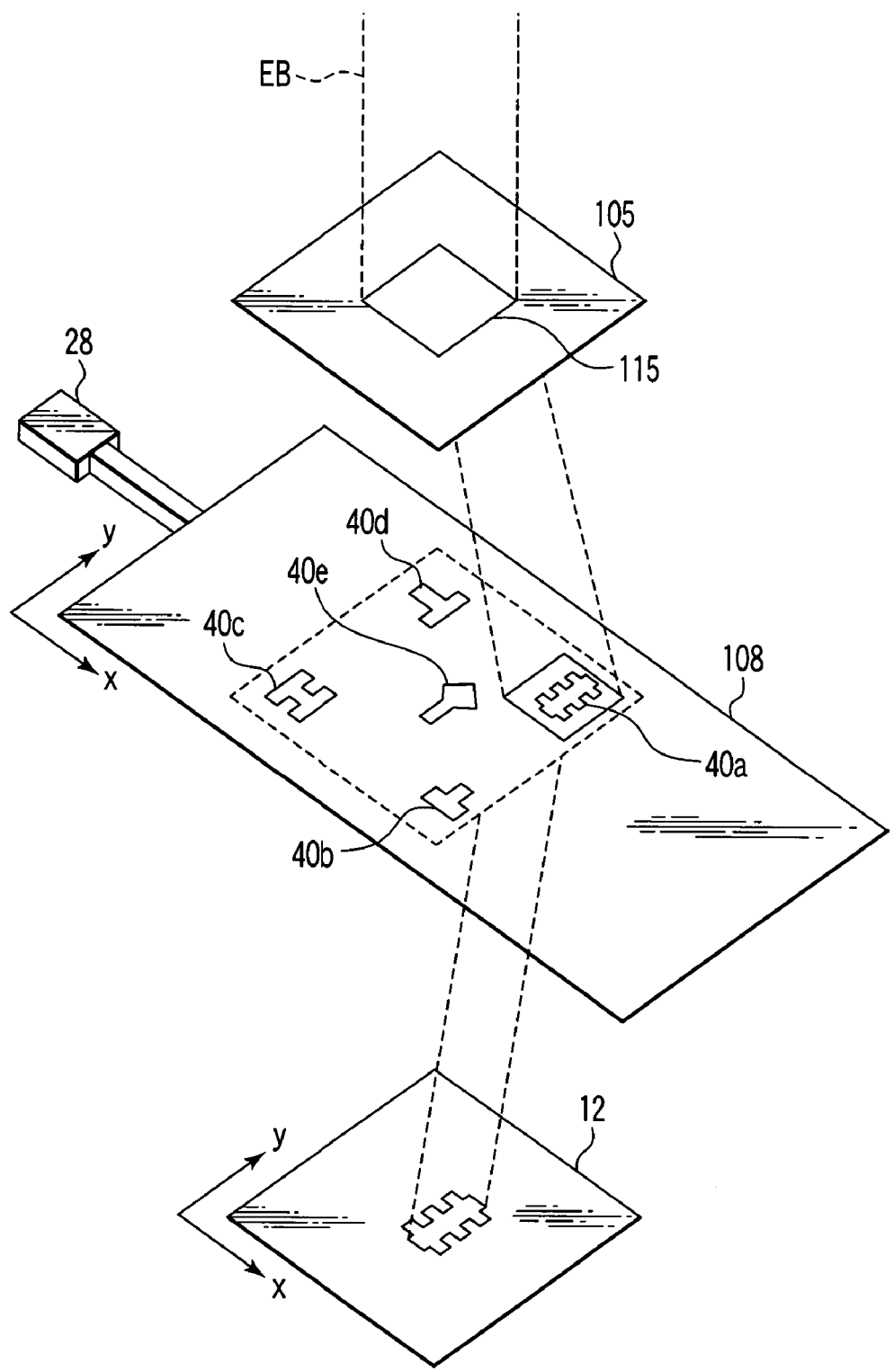
FIG. 3 is a perspective view showing a relationship between a shaping aperture and a CP aperture according to the first embodiment of the invention.

As shown in FIG. 3, a rectangular shaping opening 115 is formed in the shaping aperture 105. The shaping aperture 105 is irradiated by the electron beam EB such that the electron beam EB is incident on an area including the entire area of the shaping opening 115 of the shaping aperture 105, so that an image of the shaping opening 115 is formed on the CP aperture 108. The position of the image of the shaping opening 115 formed on the CP aperture 108 is arbitrarily set by the shaping deflectors 109a and 109b shown in FIG. 2. A plurality of character patterns 40a, 40b, 40c, 40d, and 40e are formed in the CP aperture 108 shown in FIG. 3. The plurality of character patterns 40a to 40e are openings corresponding to drawing patterns that are frequently used to draw a circuit pattern for a semiconductor device such as a semiconductor integrated circuit (LSI), respectively. The character patterns 40a to 40e are surrounded by broken dotted lines in FIG. 3. In the example shown in FIG. 3, the image of the rectangular shaping opening 115 is formed on a portion including the character pattern 40a on the CP aperture 108. In this manner, the electron beam EB is shaped into a drawing pattern (pattern of the character pattern 40a) obtained by being transmitted through the character pattern 40a. The electron beam EB shaped into the drawing pattern is irradiated onto the wafer 12. A through hole for correcting the electron beam EB and openings corresponding to patterns formed in different films in a multilayered film of a semiconductor device may be formed in the CP aperture 108 at once. An aperture drive mechanism 29 is connected to the CP aperture 108. The aperture drive mechanism 29 moves the CP aperture 108 to set overlap between the image of the shaping opening 115 and any one of the plurality of character patterns 40a to 40e. As the aperture drive mechanism 29, an ultrasonic motor, a piezoelectric element, an electric motor, or the like can be used.

The shaping deflector 109a, as shown in FIG. 4, deflects the electron beam EB having been transmitted through the second projection lens 107 from the optical axis of the reducing lens 110 by a predetermined angle to orient the electron beam EB to a position on the CP aperture 108 on which the image of the shaping opening 115 is to be projected. The shaping deflector 109b swings back the electron beam EB parallel to the optical axis of the reducing lens 110 to cause the electron beam EB to be perpendicularly incident on the CP aperture 108. The shaping deflector 109c deflects the electron beam EB having transmitted through the CP aperture 108 to orient the electron beam EB to the optical axis of the reducing lens 110. The shaping deflector 109d swings back the electron beam EB such that the electron beam EB travels along the optical axis of the reducing lens 110. In this manner, even though the electron beam EB is transmitted through any one of the character patterns 40a to 40e shown in FIG. 3 in the CP aperture 108, the electron beam EB is oriented by the shaping deflectors 109c and 109d to the reducing lens 110 parallel to the optical axis. For this reason, even though the electron beam EB is largely deflected by the shaping deflectors 109a and 109b on the CP aperture 108, it is possible to suppress an error of the projection position of the electron beam EB on the wafer 12 with respect to a drawing position.

When a semiconductor device is to be manufactured, a circuit pattern is drawn on a resist film by a combination of a CP scheme and a VSB scheme. For example, the character pattern 40e of the CP aperture 108 shown in FIG. 3 has a shape obtained by combining a triangle and a rectangle. In this case, the image of the shaping opening 115 and the character pattern 40e partially overlap to make it possible to irradiate the electron beam EB shaped into triangular and rectangular shapes on the wafer 12. When the VSB scheme is employed, the electron beam EB may be deflected by using only one shaping deflector 109a of the shaping deflectors 109c and 109d as shown in FIG. 5. When the electron beam EB is deflected by using only one shaping deflector 109a, the width of deflection of the electron beam EB is small. For this reason, the operation of making the traveling direction of the electron beam EB parallel to the optical direction by the shaping deflectors 109c and 109d may be omitted.

A main objective deflector 113a and a sub-objective deflector 113b are arranged in the vicinity of the objective lens 111 shown in FIG. 2. The main objective deflector 113a and the sub-objective deflector 113b deflect the electron beam EB shaped by the shaping aperture 105 and the CP aperture 108 to set the focal position of the electron beam EB on the surface of the resist film on the wafer 12. The sub-objective deflector 113b deflects, for example, the electron beam EB by 50 μm. A sub-deflection region on which the electron beam EB can be deflected and incident by the sub-objective deflector 113b is called a "sub-field". The sub-objective deflector 113b deflects the electron beam EB and causes the electron beam EB to be incident on a shot position on a sub-field. The main objective deflector 113a deflects, for example, the electron beam EB by 1.5 mm. A main deflection region on which the electron beam EB can be deflected and incident by the main objective deflector 113a is called a "frame". The main objective deflector 113a deflects the electron beam EB and causes the electron beam EB to be incident on the sub-field on the frame.

Figure 6:
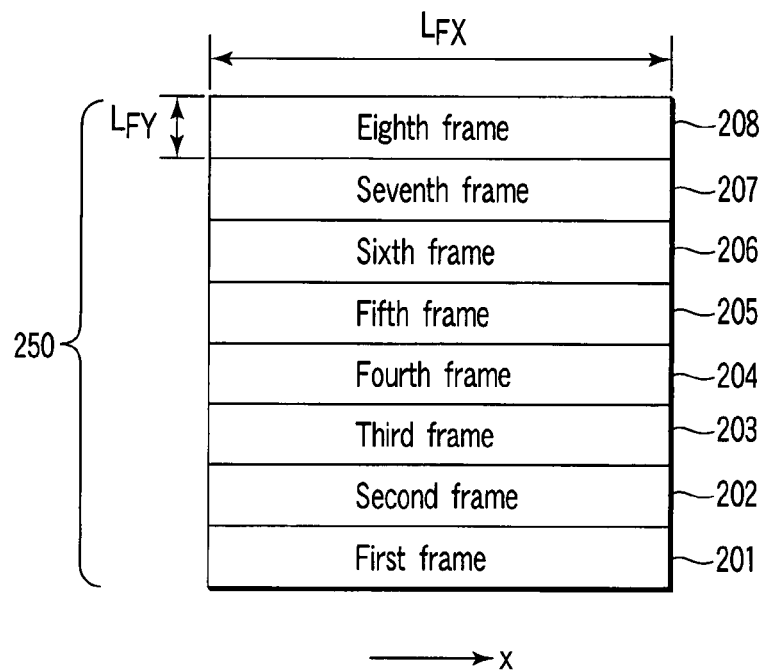
FIG. 6 is a pattern diagram showing a frame constituting a drawing area according to the first embodiment of the invention.
Figure 7:
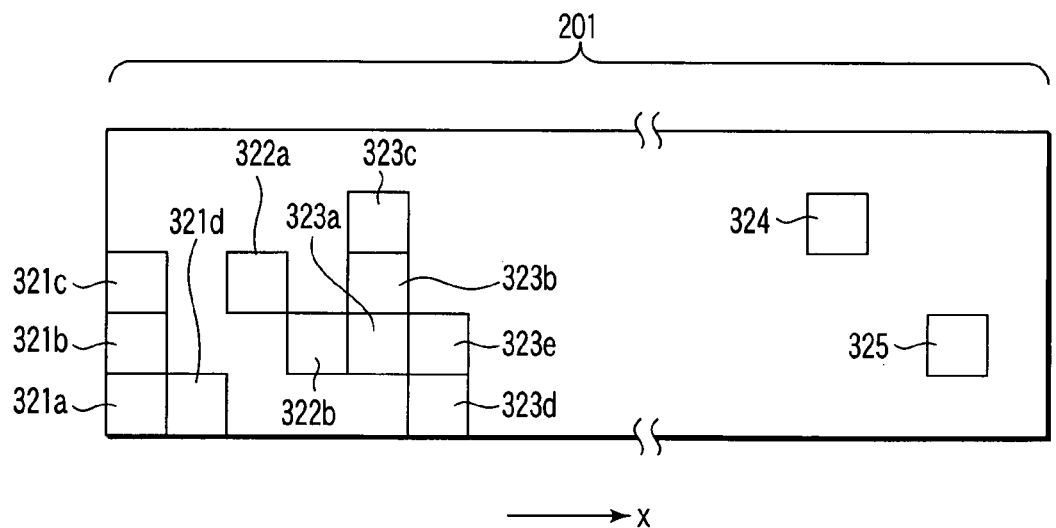
FIG. 7 is a pattern diagram showing a sub-field defined in the frame according to the first embodiment of the invention.

Below the objective lens 111, as shown in FIG. 2, a movable stage 116 to hold the wafer 12 is arranged. The movable stage 116 can be continuously moved in an X-Y direction perpendicular to the optical direction (Z direction) of the objective lens 111. When a circuit pattern for a semiconductor device is to be drawn on the resist film on the wafer 12, a drawing area on the resist film, as shown in FIG. 6, is divided into a first frame 201, a second frame 202, a third frame 203, a fourth frame 204, a fifth frame 205, a sixth frame 206, a seventh frame 207, and an eighth frame 208. The frames 201 to 208 each have a width LFX in an X direction and a width LFY in a Y direction. The width LFY in the Y direction corresponds to a width that allows the main objective deflector 113a shown in FIG. 2 to deflect the electron beam EB. A plurality of portions on which portions of the circuit pattern of the first frame 201 are drawn are defined, as shown in FIG. 7, as a plurality of sub-fields 321a, 321b, 321c, 321d, 322a, 322b, 323a, 323b, 323c, 323d, 323e, 324, and 325. The plurality of sub-fields 321a to 321d, 322a, 322b, 323a to 323e, 324, and 325 have a width corresponding to a width that allows the sub-objective deflector 113b shown in FIG. 2 to deflect the electron beam EB. Even in each of the second to eighth frames 202 to 208, a plurality of sub-fields are defined. While the movable stage 116 shown in FIG. 2 is moved in the X direction, the electron beam EB the shape of which is shaped by the CP aperture 108 shown in FIG. 2 is irradiated on a shot position 421a shown in FIG. 8 in the sub-field 321a of the first frame 201 shown in FIG. 7 to partially draw a circuit pattern of the semiconductor device. After the electron beam EB is irradiated on the shot position 421a shown in FIG. 8, the electron beam EB shaped by the CP aperture 108 shown in FIG. 2 is irradiated on a shot position 421b. Thereafter, similarly, the electron beam EB shaped by the CP aperture 108 shown in FIG. 2 is irradiated on each of a plurality of shot positions in the plurality of sub-fields 321a to 321d, 322a, 322b, 323a to 323e, 324, and 325 to partially draw the circuit pattern of the semiconductor device. Upon completion of the drawing of the first frame 201, the movable stage 116 is moved in the Y direction perpendicular to the X direction. Thereafter, as in the first frame 201, the circuit pattern of the semiconductor device is partially drawn in the second frame 202 while the movable stage 116 is moved in the X direction. Subsequently, as in the second frame 202, the circuit pattern of the semiconductor device is partially drawn in the third to eighth frames 203 to 208.

A mirror 220 is arranged on the movable stage 116. A laser length measurer 20 is arranged in a sample chamber 15 which stores the movable stage 116. The laser length measurer 20 irradiates a laser on the mirror 220 to monitor the position of the movable stage 116. A detector 16 is further arranged in the sample chamber 15. The detector 16 detects reflected electrons and secondary electrons generated by irradiating the electron beam EB on a positioning mark formed on the wafer 12.

The control device 300 has a blanking amplifier 122, a shaping deflection amplifier 120, and an objective deflection amplifier 121. The blanking amplifier 122 applies a deflection voltage to the blanking electrode 130 so as to set the start and end of irradiation of the electron beam EB on the resist film on the wafer 12, so that a dose of the electron beam EB onto the resist film is adjusted. The shaping deflection amplifier 120 applies deflection voltages to the shaping deflectors 109a, 109b, 109c, and 109d, respectively, so as to set the shape and size of the electron beam EB irradiated on the resist film on the wafer 12. The shaping deflection amplifier 120 determines any one of a CP scheme and a VSB scheme used for drawing a drawing pattern depending on a size of the drawing pattern or a flag or the like which selects any one of the CP scheme and the VSB scheme, and selects a shaping deflector to be used from the shaping deflectors 109a to 109d. The deflection voltages applied to the shaping deflectors 109a to 109d are, for example, ±40 V, which allows the electron beam EB to be moved by 1 mm on the CP aperture 108. The objective deflection amplifier 121 applies deflection voltages to the main objective deflector 113a and the sub-objective deflector 113b to set a scanning position of the electron beam EB irradiated on the resist film on the wafer 12.

The control device 300 includes a stage drive circuit 21, a position calculating module 23, and a control module 22. The stage drive circuit 21 sets a moving direction and a moving speed of the movable stage 116. The position calculating module 23 amplifies signals of reflected electrons and secondary electrons from a positioning mark formed on the wafer 12 to remove noise. Furthermore, the position calculating module 23 sets a slice level, and a position where the secondary electron signal traverses the slice level is considered as an edge of a step of the positioning mark to calculate an actual position of the positioning mark. The control module 22 controls the blanking amplifier 122, the shaping deflection amplifier 120, the objective deflection amplifier 121, the stage drive circuit 21, and the position calculating module 23.

In this case, the number of character patterns 40a to 40e which can be formed in the CP aperture 108 shown in FIG. 3 is considerably limited by the size of the CP aperture 108. The character pattern extracting system shown in FIG. 1 is a system which extracts the character patterns 40a to 40e which can be formed in the CP aperture 108 from character patterns the number of which is larger than the maximum number of character patterns 40a to 40e which can be formed in the CP aperture 108. The character pattern extracting system includes a central processing unit (CPU) 50. The CPU 50 has a ranking unit 51, a first extracting unit 52, a combination unit 53, and a second extracting unit 54. The ranking unit 51 ranks character patterns the number of which is larger than the maximum number of character patterns which can be formed in the CP aperture 108 shown in FIG. 3 by the number of times of reference to hierarchical data of a semiconductor device. The first extracting unit 52 extracts first extraction patterns the number of which is smaller than the maximum number of character patterns which can be formed in the CP aperture 108 shown in FIG. 3 from a large number of character patterns in a descending order of the number of times of reference. Furthermore, the first extracting unit 52 defines patterns except for the first extraction pattern out of the large number of character patterns as a plurality of candidate patterns. The combination unit 53 selects, from the plurality of candidate patterns, a plurality of candidate patterns the number of which is equal to a difference obtained by subtracting the number of extracted first extraction patterns from the maximum number of patterns which can be formed in the CP aperture 108 shown in FIG. 3, to thereby create all combinations of the plurality of selected candidate patterns. The second extracting unit 54 extracts, as a plurality of second extraction patterns, some of the plurality of candidate patterns included in a combination out of the plurality of combinations, in which time for manufacturing a semiconductor device is shortest.

The CPU 50 further includes an image processing unit 301. The image processing unit 301 performs image processing such as hierarchical development, resizing, inversion, and removal of overlapping to hierarchical design data of a circuit pattern of the semiconductor device. The removal of overlapping prevents a decrease in drawing accuracy caused by multiple exposure. The hierarchical design data is constituted by a combination of a plurality of blocks. Information defined in a block includes information of a cell pattern constituting a circuit pattern or reference information of another block, or both the information of the cell pastern and the reference information of the block. The hierarchical design data has a hierarchical structure. A block refers to another block, and the referred block refers to still another block. When a plurality of specific cell patterns are arranged on the circuit pattern, the specific cell patterns are referred in the hierarchical design data twice or more. In the following description, the number of times of reference to the specific cell patterns in the design data is called the number of times of reference.

A data storage device 60 is connected to the CPU 50. The data storage device 60 includes a character database 383. A plurality of character patterns set in the CP aperture 108 shown in FIG. 2 are registered in the character database 383. An identification number, a pattern name, graphic information, or the like is given to each of the plurality of registered character patterns. In this embodiment, the identification number is given.

The ranking unit 51 shown in FIG. 1 analyzes design data and analyzes the number of times of reference in design data before hierarchical development in each of the plurality of cell patterns. Furthermore, the ranking unit 51 ranks the plurality of cell patterns in a descending order of the number of times of reference. The ranking unit 51 searches the character database 383 to check whether or not character patterns similar to the plurality of ranked cell patterns are registered in the order from the first-ranking cell pattern. When the character patterns similar to the cell patterns are registered in the character database 383, the ranking unit 51 extracts identification numbers of the character patterns from the character database 383. In this case, for example, it is assumed that the maximum number of character patterns which can be set in the CP aperture 108 is 50. In this case, the ranking unit 51 extracts from the character database 383 a large number (for example, 60) of character patterns the number of which is larger than the maximum number (50) of character patterns which can be formed in the CP aperture 108 shown in FIG. 2.

Figures 8, 9:
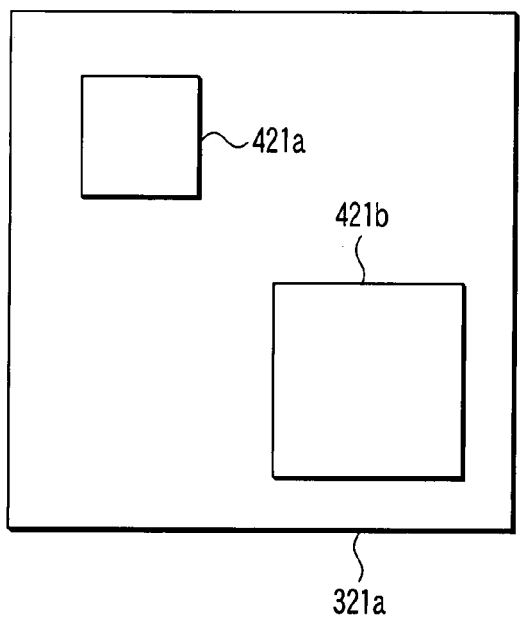
FIG. 8 is a pattern diagram showing a shot position defined in the sub-field according to the first embodiment of the invention.
FIG. 9 is a pattern diagram of an order list according to a comparative example of the first embodiment of the invention.

The ranking unit 51, as shown in FIG. 9, creates a ranking list having recorded thereon identification numbers and the number of times of reference of the plurality of character patterns ranked by the number of times of reference. In the ranking list, for example, the number of times of reference of a character pattern which is referred the maximum number of times is 1000. The number of times of reference of a character pattern the number of which is the second maximum number of times of reference is 900. The ranking list may include the number of graphics and a product of the number of times of reference and the number of graphics which are necessary if a character pattern is drawn by a VSB.

The first extracting unit 52 shown in FIG. 1 sets, as the number of extracted character patterns, a number smaller than the maximum number (50) of character patterns which can be formed in the CP aperture 108 shown in FIG. 2. For example, it is assumed that the number of extracted character patterns is 40. Furthermore, the first extracting unit 52 extracts, as a plurality of first extracted patterns, the character patterns which is referred the maximum number of times or the character patterns which is referred the fortieth maximum number of times from the ranking list shown in FIG. 9. The first extracting unit 52 defines, as candidate patterns, character patterns which are referred the forty-first maximum number of times to character patterns which are referred the sixtieth maximum number of times.

The combination unit 53 calculates a difference between the maximum number of character patterns which can be formed in the CP aperture 108 shown in FIG. 2 and the number of extracted first extraction patterns. When the maximum number and the number of extracted patterns are 50 and 40, respectively, the difference is 10. Furthermore, the combination unit 53 creates 184,756 combinations of candidate patterns when ten candidate patterns, i.e., the difference between the maximum number and the number of extracted patterns are selected from 20 candidate patterns according to the following equation (1). The combination unit 53 sets "n" as a natural number selected from 1 to 184,756 to define the 184,756 combinations of candidate patterns as an "nth combination".

$$20C10=184,754 \quad (1)$$

A pattern list creating unit 303 creates a pattern list including 40 first extraction patterns and 10 candidate patterns included in the nth combination. Since the natural number selected from 1 to 184,756 is given as "n", 184,756 pattern lists are created. The pattern list creating unit 303 defines the 184,756 pattern lists as "nth pattern lists", respectively.

Figure 10:
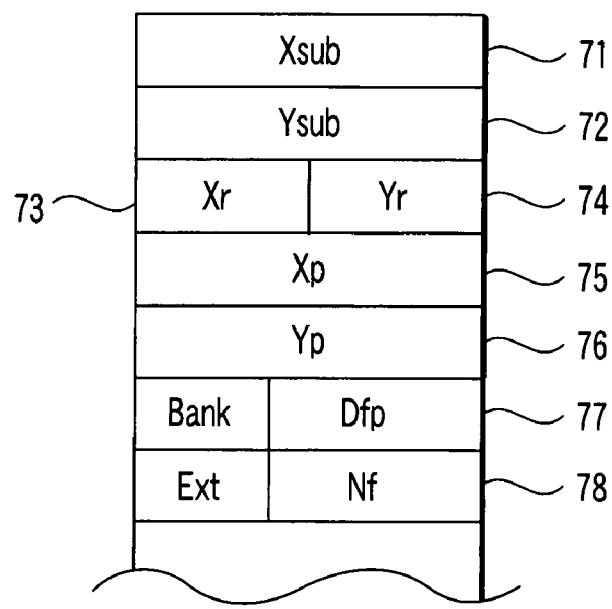
FIG. 10 is a pattern diagram of sub-field data according to a modification of the first embodiment of the invention.
Figure 11:
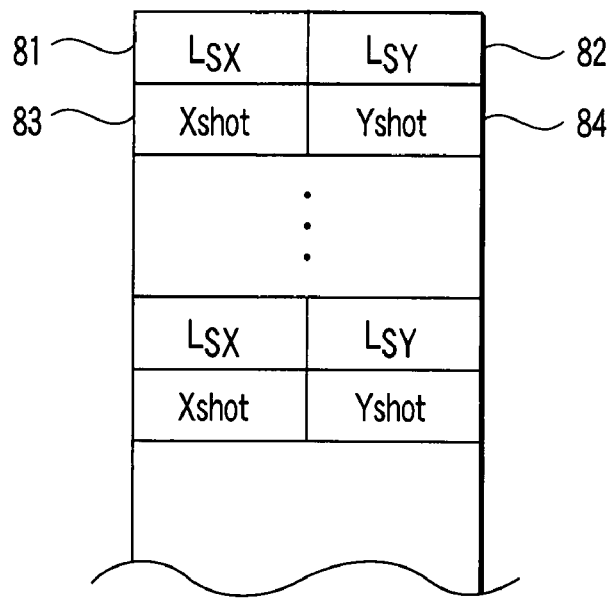
FIG. 11 is a pattern diagram of shot data according to a modification of the first embodiment of the invention.

A drawing data creating unit 304 creates "nth drawing data" from the "nth pattern lists". The nth drawing data includes sub-field data in which information related to a sub-field and shot data in which information related to a shot position of the electron beam EB is recorded. As the sub-field data shown in FIG. 10, there are recorded pieces of information of an X coordinate 71 in a frame of a sub-field, a Y coordinate 72 in the frame of the sub-field, the number of repetitions 73 in the X direction, the number of repetitions 74 in the Y direction, a pitch 75 in the X direction, a pitch 76 in the Y direction, an address 77 of the shot data, and the number of graphics 78. As shot data shown in FIG. 11, there are recorded pieces of information of a width 81 in the X direction of a shot position, a width 82 in the Y direction of the shot position, an X-coordinate 83 of the shot position, and a Y-coordinate 84 of the shot position. The nth drawing data includes a flag indicating a drawing method. Depending on the drawing method flag, it is designated whether some of circuit patterns are drawn by the CP scheme or the VSB scheme.

A prediction unit 305 has an internal counter "n". The prediction unit 305 defines a natural number in the internal counter "n". The prediction unit 305 predicts, by using the "nth drawing data", drawing time of the circuit pattern by a charged particle beam drawing apparatus when the 40 first extraction patterns and the 10 candidate patterns included in the "nth pattern list" are set in the CP aperture 108. The prediction unit 305, as shown in FIG. 6, divides a drawing area 250 into the first to eighth frames 201 to 208 each having a width defined by a deflection width of the main objective deflector 113a shown in FIG. 2.

Figure 12:
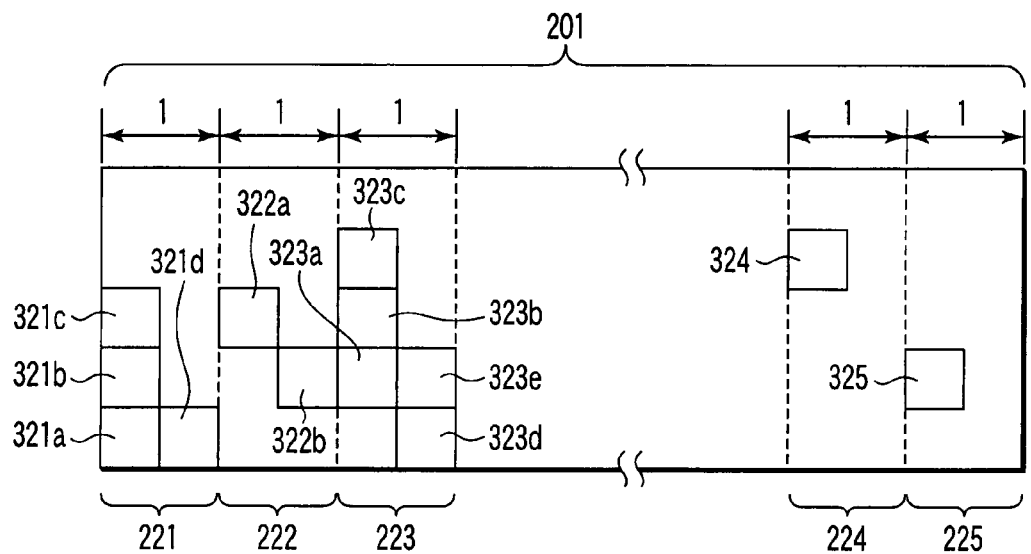
FIG. 12 is a pattern diagram showing a sample area defined in the frame according to the first embodiment of the invention.

Furthermore, the prediction unit 305, as shown in FIG. 12, virtually divides the first frame 201 in the X direction into a first sample area 221, a second sample area 222, a third sample area 223, a j−1th sample area 224, and a jth sample area 225. The "j" is a natural number. Each of the first to jth sample areas 221 to 225 has a width l. The prediction unit 305 virtually divides each of the second to eighth frames 202 to 208 into the first to jth sample areas.

The prediction unit 305 calculates sample area drawing time tn-ij which is drawing time in the jth sample area of the ith frame when the "nth pattern list" and the "nth drawing data" are used such that "i" is set to a natural number selected from 1 to 8.

$$tn\text{-}ij = N\text{sub} \times ts1 + Nn\text{-shot} \times (ts2 + td) \quad (2)$$

In equation (2), reference symbol Nsub denotes the number of sub-fields included in the jth sample area of the ith frame. Reference symbol ts1 denotes settling time (main deflection settling time) until the electron beam EB moves to the sub-field by a deflection voltage to be applied by the main objective deflector 113a shown in FIG. 2. Reference symbol Nn-shot denotes the number of shots of the electron beam EB in the jth sample area of the ith frame when the "nth pattern list" and the "nth drawing data" are used. Reference symbol ts2 denotes settling time (sub-deflection settling time) until the electron beam EB moves to a shot position in the sub-field by a deflection voltage to be applied by the sub-objective deflector 113b. Reference symbol td denotes irradiation time required for one shot.

Figure 13:
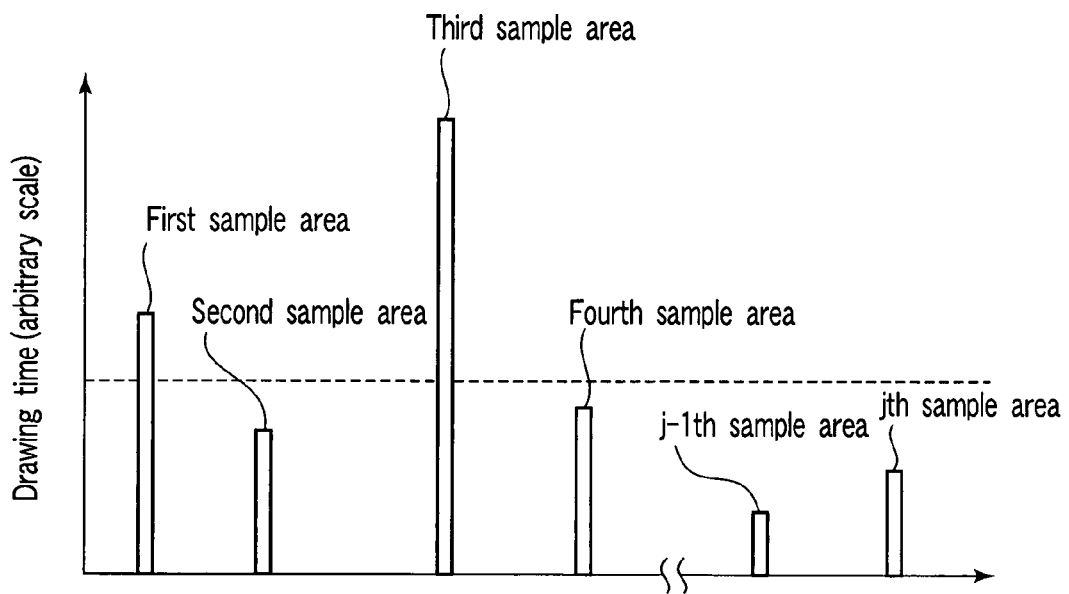
FIG. 13 is a graph showing drawing time in each sample area according to the first embodiment of the invention.

FIG. 13 shows examples of sample area drawing times tn-11 to tn-1j of the first to jth sample areas 221 to 225 of the first frame 201 shown in FIG. 12 when the "nth pattern list" and the "nth drawing data" are used. The prediction unit 305 shown in FIG. 1 extracts a sample area having the longest sample area drawing time from the first to jth sample areas 221 to 225 of the first frame 201. In the examples shown in FIG. 13, the third sample area 223 is a sample area having the longest sample area drawing time. The prediction unit 305 shown in FIG. 1 extracts the sample areas each having the longest sample area drawing time with respect to the second to eighth frames 202 to 208. In this case, when the prediction unit 305 uses the "the nth pattern list" and the "nth drawing data", sample area drawing time in a sample area having the longest sample area drawing time in the ith frame is represented by tn-i-max.

Furthermore, when the prediction unit 305 uses the "nth pattern list" and the "nth drawing data", the maximum moving speed vn-i-max of the movable stage 116 shown in FIG. 2 is calculated by the following equation (3). The maximum moving speed can be set when drawing a sample area having the longest sample area drawing time in the ith frame.

$$vn\text{-}i\text{-max}=l/tn\text{-}i\text{-max} \quad (3)$$

Figure 14:
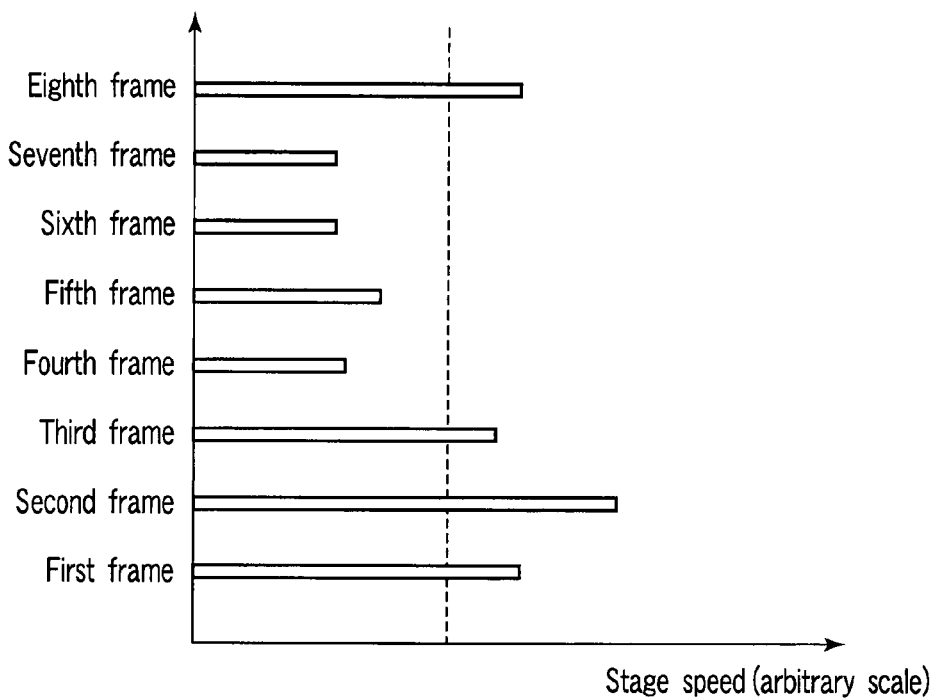
FIG. 14 is a graph showing a moving speed of a moving stage in each frame according to the first embodiment of the invention.

The prediction unit 305 shown in FIG. 1 sets the moving speed vn-i-max of the movable stage 116 given by equation (3) as a moving speed of the movable stage 116 used when the ith frame is drawn in the case of using the "nth pattern list" and the "nth drawing data". FIG. 14 shows examples of moving speeds vn-1-max to vn-8-max of the movable stage 116 in the first to eighth-frames calculated by equation (3).

Figure 15:
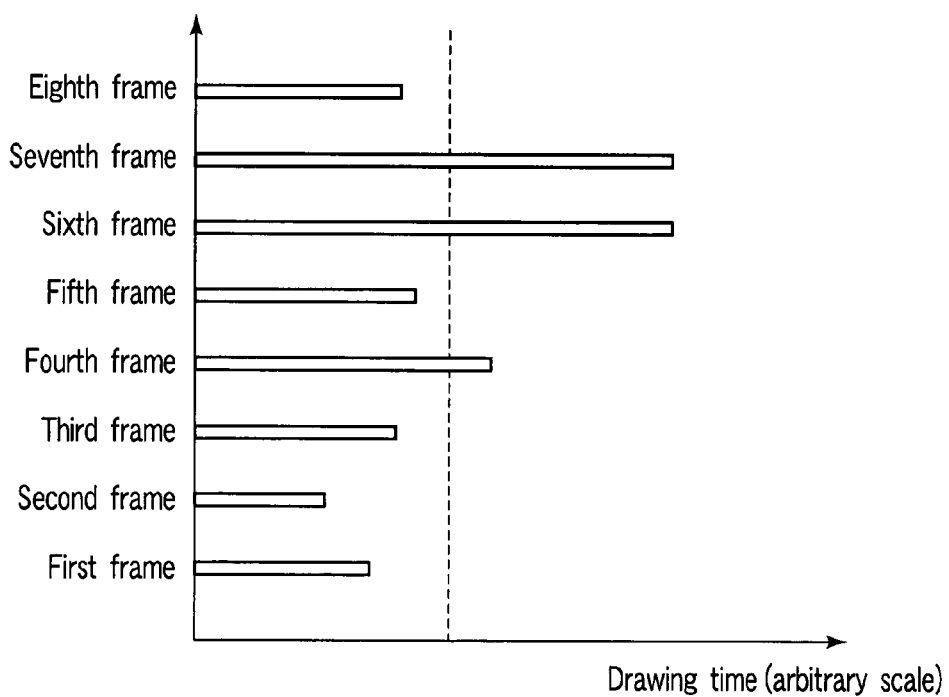
FIG. 15 is a graph showing drawing time in each frame according to the first embodiment of the invention.

The prediction unit 305 shown in FIG. 1 calculates frame drawing time tn-i which is drawing time of the ith frame given by the following equation (4) when the "nth pattern list" and the "nth drawing data" are used. FIG. 15 shows examples of frame drawing times tn-1 to tn-8 of the first to eighth frames 201 to 208 calculated by equation (4).

$$tn\text{-}i=LFX/vn\text{-}i\text{-max} \quad (4)$$

The prediction unit 305 shown in FIG. 1 adds frame drawing times tn-1 to tn-8 of the first to eighth frames 201 to 208 in the drawing area 250 shown in FIG. 6 to each other as expressed by the following equation (5) when the "nth pattern list" and the "nth drawing data" are used, to thereby calculate drawing time Tn-all of the entire drawing area 250. The prediction unit 305 adds 1 to the internal counter "n" when the drawing time Tn-all is calculated. The prediction unit 305 determines whether a value of the internal counter "n" is larger than 184,756 which is the total number of combinations of candidate patterns. When the value of the internal counter "n" is 184,756 or less, the prediction unit 305 repeats the calculation of the drawing time Tn-all. When the value of the internal counter "n" is larger than 184,756, the prediction unit 305 ends the calculation of the drawing time Tn-all.

$$Tn\text{-all}=\Sigma tn\text{-}i \quad (5)$$

The second extracting unit 54 compares drawing time T1-all obtained in the case of using the "first pattern list" and the "first drawing data", drawing time T2-all obtained in the case of using the "second pattern list" and the "second drawing data", drawing time T3-all obtained in the case of using the "third pattern data" and the "third drawing data", ... , drawing time T184,756-all obtained in the case of using the "184,756th pattern list" and the "184,756th drawing data" with each other to extract a pattern list which gives the shortest drawing time Topt. Furthermore, the second extracting unit 54 defines a plurality of candidate patterns included in the pattern list which gives the shortest drawing time Topt as a plurality of second extraction patterns, respectively. The second extracting unit 54 defines the pattern list which gives the shortest drawing time Topt as a selection list.

$$Topt=\text{Min}(T1\text{-all},T2\text{-all},T3\text{-all},\ldots,T184{,}756\text{-all}) \quad (6)$$

The data storage device 60 further includes a chip data storage unit 380, a processing data storage unit 381, a ranking list storage unit 384, an extraction pattern storage unit 385, a candidate pattern storage unit 386, a combination storage unit 387, a pattern list storage unit 388, a drawing data storage unit 389, a drawing time storage unit 390, and a selection list storage unit 391. The chip data storage unit 380 stores hierarchical design data of a circuit pattern. The processing data storage unit 381 stores design data subjected to image processing by the image processing unit 301. The ranking list storage unit 384 stores a ranking list shown in FIG. 9 created by the ranking unit 51. The extraction pattern storage unit 385 shown in FIG. 1 shows a plurality of first extraction patterns extracted by the first extracting unit 52. The candidate pattern storage unit 386 stores a plurality of candidate patterns. The combination storage unit 387 stores the "nth combination" created by the combination unit 53. The pattern list storage unit 388 stores the "nth pattern list" created by the pattern list creating unit 303. The drawing data storage unit 389 stores drawing data created by the drawing data creating unit 304. The drawing time storage unit 390 stores the drawing time Tn-all of the entire drawing area 250 as shown in FIG. 6 when the "nth pattern list" and the "nth drawing data" predicted by the prediction unit 305 are used. The selection list storage unit 391 shown in FIG. 1 stores a selection list selected by the second extracting unit 54.

An input device 312, an output device 313, a program storage device 330, and a temporary storage device 331 are connected to the CPU 50 shown in FIG. 1. A keyboard, a mouse, or the like can be used as the input device 312. As the output device 313, a liquid crystal display device (LCD), a monitor screen achieved by a light-emitting diode (LED), or the like can be used. The program storage device 330 stores a program to cause the CPU 50 to execute data transmission/reception between devices connected to the CPU 50. The temporary storage device 331 temporarily stores data in an arithmetic operation process of the CPU 50.

A character pattern extracting method according to the first embodiment will be described below with reference to a flow chart shown in FIG. 16. Arithmetic operation results obtained by the CPU 50 shown in FIG. 1 are sequentially stored in the temporary storage device 331.

(a) In step S101, the image processing unit 301 shown in FIG. 1 reads hierarchical design data of a circuit pattern from the chip data storage unit 380. The image processing unit 301 then performs image processing to the design data. The image processing unit 301 stores the design data subjected to the image processing in the processing data storage unit 381. In step S102, the ranking unit 51 reads the design data subjected to image processing from the processing data storage unit 381. The ranking unit 51 analyzes design data to analyze the numbers of times of reference in hierarchical structures in a plurality of cell patterns included in the design data. The ranking unit 51 ranks the plurality of cell patterns in a descending order of the numbers of times of reference.

(b) In step 5103, the ranking unit 51 searches the character database 383 sequentially from a first-ranking cell pattern to check whether or not character patterns similar to a plurality of ranked cell patterns are registered in the character database 383. When a character pattern similar to a cell pattern is found in the character database 383, the ranking unit 51 extracts the character pattern from the character database 383. When the maximum number of character patterns which can be set in the CP aperture 108 shown in FIG. 2 is 50, the ranking unit 51 shown in FIG. 1 extracts character patterns the number (60) of which is larger than the maximum number (50) from the character database 383.

(c) In step S104, the ranking unit 51 creates the ranking list shown in FIG. 9 and having recorded therein the numbers of times of reference of the 60 extracted character patterns and the corresponding cell patterns. Thereafter, the ranking unit 51 shown in FIG. 1 stores the created ranking list in the ranking list storage unit 384. In step S105, the first extracting unit 52 reads the ranking list shown in FIG. 9 from the ranking list storage unit 384. The first extracting unit 52 shown in FIG. 1 sets, for example, 40 as the number of extracted character patterns that is smaller than the maximum number, and extracts the number of first- to fortieth-ranking extracted character patterns ranked by the numbers of times of reference as first extraction patterns from the ranking list shown in FIG. 9. Thereafter, the first extracting unit 52 shown in FIG. 1 stores the 40 extracted first extraction patterns in the extraction pattern storage unit 385.

(d) In step S106, the first extracting unit 52 defines the forty-first- to sixtieth-ranking character patterns ranked by the numbers of times of reference as candidate patterns. Then, the first extracting unit 52 stores 20 candidate patterns in the candidate pattern storage unit 386.

(e) In step S107, the combination unit 53 calculates the 40 first extraction patterns from the extraction pattern storage unit 385. The combination unit 53 then calculates a difference between the maximum number (50) of character patterns which can be formed in the CP aperture 108 shown in FIG. 2 and the number (40) of first extraction patterns. In this case, the difference is 10.

(f) In step S108, the combination unit 53 reads 20 candidate patterns from the candidate pattern storage unit 386. The combination unit 53 creates 184,756 combinations of candidate patterns when 10 candidate patterns are selected from the 20 candidate patterns. Thereafter, the combination unit 53 defines the 184,756 combinations of candidate patterns as "nth combinations". The combination unit 53 stores the "nth combinations" in the combination storage unit 387.

(g) In step S109, the pattern list creating unit 303 reads 40 first extraction patterns from the extraction pattern storage unit 385. The pattern list creating unit 303 reads the 184,756 combinations of candidate patterns from the combination storage unit 387. Then, the pattern list creating unit 303 create an "nth pattern list" including the 40 first extraction patterns and the 10 candidate patterns included in the "nth combinations". The pattern list creating unit 303 stores first to 184,756th pattern lists in the pattern list storage unit 388.

(h) In step S110, the drawing data creating unit 304 reads the first to 184,756 pattern lists from the pattern list storage unit 388. The drawing data creating unit 304 creates "nth drawing data" on the basis of the "nth pattern lists". The drawing data creating unit 304 stores the created first to nth drawing data in the drawing data storage unit 389.

(i) In step S111, the prediction unit 305 defines 1 as a value of the internal counter "n". In step S112, the prediction unit 305 reads the "nth pattern list" from the pattern list storage unit 388 and the "nth drawing data" from the drawing data storage unit 389. When the value of the internal counter "n" is 1, the "first pattern list" and the "first drawing data" are read. The prediction unit 305, as shown in FIG. 6, divides the drawing area 250 in which a circuit pattern is drawn by using the "nth pattern list" and the "nth drawing data" into the first to eight frames 201 to 208.

(j) In step S113, the prediction unit 305, as shown in FIG. 12, virtually divides the first frame 201 into the first to jth sample areas 221 to 225 in the X direction. The prediction unit 305 virtually divides each of the second to eighth frames 202 to 208 into the first to jth sample areas. In step S114, the prediction unit 305 calculates drawing times tn-11 to tn-1j required to draw the first to jth sample areas 221 to 225 of the first frame 201 in the case of using the "nth pattern list" and the "nth drawing data". In step S115, the prediction unit 305 extracts drawing time tn-1-max of a sample area having the longest drawing time in the first frame 201 from the drawing time tn-11 to tn-1j.

(k) In step S116, the prediction unit 305 extracts drawing times tn-2-max to tn-8-max of sample areas each having the longest drawing time in the second to eighth frames 202 to 208 as well. In step S117, the prediction unit 305 calculates a moving speed vn-1-max of the movable stage 116 which can be set when the sample area having the longest drawing time in the first frame 201 is drawn on the basis of the equation (3) when the "nth pattern list" and the "nth drawing data" are used. The prediction unit 305 also calculates moving speeds vn-2-max to vn-8-max of the movable stage 116 which can be set when the sample areas each having the longest drawing time are drawn with respect to the second to eighth frames 202 to 208.

(l) In step S118, the prediction unit 305 calculates drawing times tn-1 to tn-8 of the first to eighth frames 201 to 208 by using the equation (4) when the "nth pattern list" and the "nth drawing data" are used. In step S119, the prediction unit 305 adds the drawing times tn-1 to tn-8 of the first to eighth frames 201 to 208 to each other to calculate drawing time Tn-all of the entire drawing area 250 shown in 6. The prediction unit 305 shown in FIG. 1 stores the drawing time Tn-all of the entire drawing area 250 in the drawing time storage unit 390 when the "nth pattern list" and the "nth drawing data" are used.

(m) In step S120, the prediction unit 305 adds 1 to the value of the internal counter "n". In step S121, the prediction unit 305 checks whether or not the value of the internal counter "n" is larger than 184,756 which is the total number of combinations of candidate patterns. When the value of the internal counter "n" is equal to or less than 184,756, the operation returns to step S112. When the value of the internal counter "n" is larger than 184,756, the operation shifts to step S122.

(n) In step S122, the second extracting unit 54 reads from the drawing time storage unit 390 the drawing time Tn-all of the entire drawing area 250 in the case of using the "nth pattern list" and the "nth drawing data". Then, the second extracting unit 54 compares the drawing times T1-all to T184,756-all with each other when the "first to 184,756th pattern lists" are used to extract a pattern list which gives the longest drawing time.

(o) In step S123, the second extracting unit 54 reads a pattern list which gives the shortest drawing time Topt from the "first to 184,756th pattern lists" stored in the pattern list storage unit 388. The second extracting unit 54 defines, as a plurality of second extraction patterns, a plurality of candidate patterns included in the pattern list which gives the shortest drawing time Topt. In step S124, the second extracting unit 54 stores the pattern list which gives the shortest drawing time Topt in the selection list storage unit 391 as a selection list, and ends the character pattern extracting method according to the first embodiment.

In a prior art, the maximum number of character patterns which can be formed in a CP aperture are selected from character patterns the number of which is larger than the maximum number of character patterns which can be formed in the CP aperture, and all the plurality of combinations of the maximum number of selected character patterns are created. With respect to all the combinations, drawing time in an entire drawing area is calculated. For example, when the number of prepared character patterns is 10 and the maximum number of character patterns which can be formed in the CP aperture is 5, the number of combinations of the character patterns is 252, and so long time is not required to calculate drawing times with respect to all the combinations. However, when the number of prepared character patterns is 60 and the maximum number of character patterns which can be formed in the CP aperture is 50, the number of combinations of the character patterns approaches $7.54 \times 10^{10}$. In this manner, when the digit number of the maximum number of character patterns which can be formed in the CP aperture is two, very long time is required to calculate drawing times with respect to all the combinations. This is not practical. If drawing times with respect to all the combinations are calculated, huge amounts of time are required to design the CP aperture. As a result, time for creating drawing data increases, and productivity of the charged particle beam drawing method using the CP scheme is deteriorated.

In contrast to this, according to the character pattern extracting method according to the first embodiment, a high-ranking character pattern ranked depending on the numbers of times of reference is extracted, combinations of only remaining character patterns (i.e., character patterns except for the extracted character patterns) are created, and drawing times are predicted with respect to the combinations. Therefore, in comparison with a conventional case in which all combinations of character patterns are created, time required to predict drawing time can be shortened. In the first embodiment, a character pattern extracted in advance is a high-ranking character pattern ranked depending on the number of times of reference. Thus, although combinations of all the character patterns are not created, i.e., although combinations of only unextracted character patterns are created, the probability of missing a combination of character patterns each having short drawing time decreases. Therefore, a circuit pattern of a semiconductor device can be drawn at a high throughput according to a charged particle beam drawing method. In the method, the CP aperture 108 shown in FIG. 3 is manufactured that includes first and second extraction patterns included in a selection list selected in step S124 as character patterns, and an electron beam EB is irradiated on a resist film by using the manufactured CP aperture 108.

Second Embodiment

Figure 17:
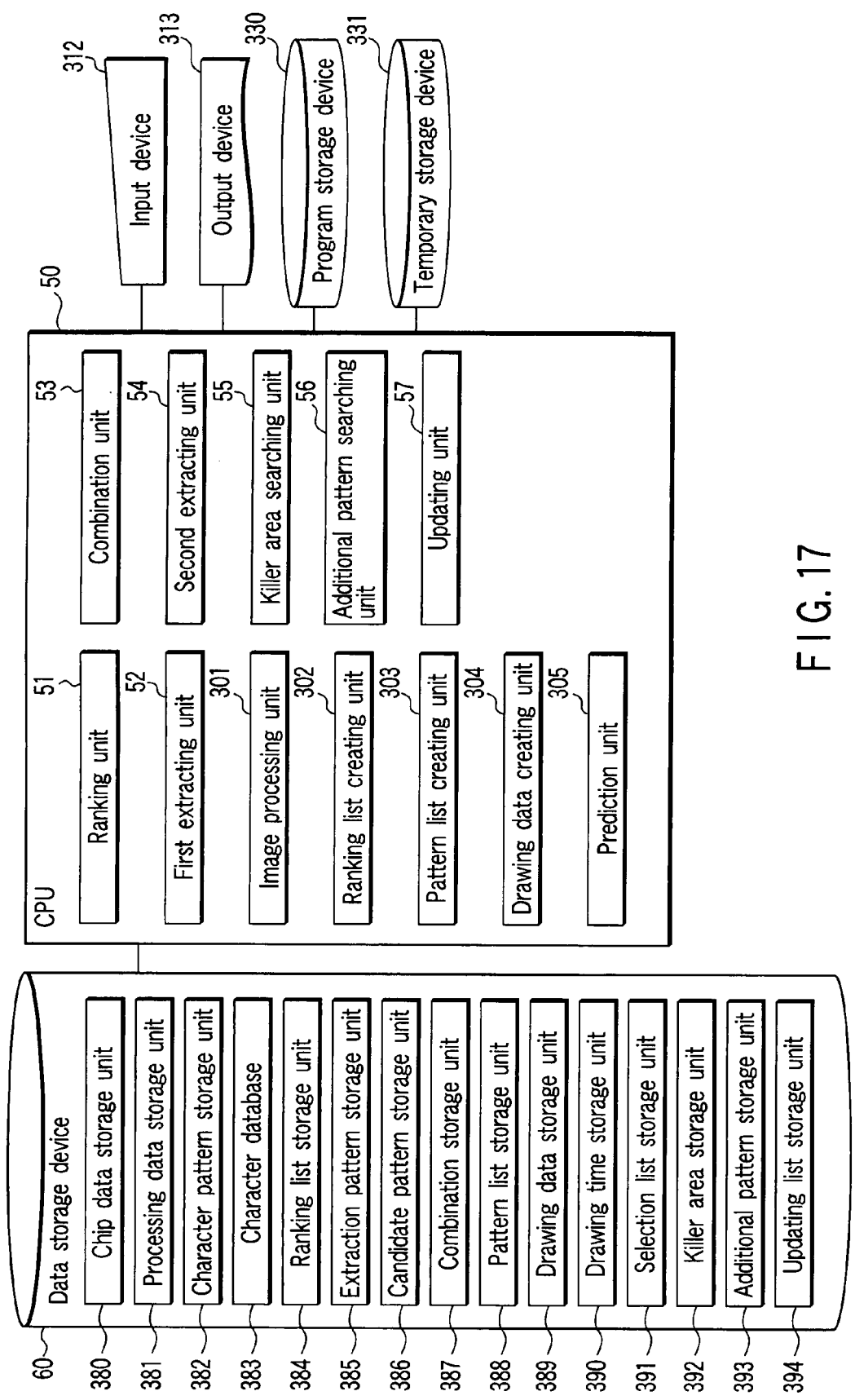
FIG. 17 is a block diagram showing a character pattern extracting system according to a second embodiment of the present invention.

A CPU 50 of a character pattern extracting system according to a second embodiment further includes a killer area searching unit 55, an additional pattern searching unit 56, and an updating unit 57 as shown in FIG. 17.

The killer area searching unit 55, as shown in FIG. 6, divides a drawing area 250 in which a circuit pattern is drawn into first to eighth frames 201 to 208. Furthermore, the killer area searching unit 55 shown in FIG. 17 virtually divides the first frame 201 into first to jth sample areas 221 to 225 in an X direction, as shown in FIG. 12. The killer area searching unit 55 shown in FIG. 17 also virtually divides each of the second to eighth frames 202 to 208 into first to jth sample areas. The killer area searching unit 55 searches for a sample area including a maximum number of sub-fields from the first to jth sample areas 221 to 225 of the first frame 201 shown in FIG. 12. The killer area searching unit 55 extracts as a killer area the sample area including the maximum number of sub-fields and found by the searching. The killer area searching unit 55 shown in FIG. 17 also extracts a killer area including a maximum number of sub-fields from the plurality of sample areas in each of the second to eighth frames 202 to 208.

The additional pattern searching unit 56 searches a character database 383 to check whether or not a character pattern similar to some of circuit patterns drawn in the killer areas is registered in the character database 383. The additional pattern searching unit 56 ranks a plurality of character patterns found by the searching by the numbers of times of reference. The ranking is also performed depending on values obtained by products between the numbers of times of reference and the number of graphics required if character patterns are drawn by VSB. Furthermore, the additional pattern searching unit 56 extracts, for example, first- to twentieth-ranking character patterns as a plurality of additional patterns. When a character pattern similar to some of the circuit patterns drawn in the killer areas is not registered in the character database 383, the additional pattern searching unit 56 may create a plurality of new additional patterns.

The updating unit 57 adds the plurality of additional patterns to a plurality of character patterns recorded in a ranking list to update the ranking list. When 60 character patterns are recorded in, for example, the ranking list, the 20 additional patterns may be directly added to update the ranking list. Alternatively, fifty-first- to sixtieth-ranking character patterns in the ranking list may be deleted, and the first- to tenth-ranking additional patterns may be added to the ranking list to update the ranking list.

The data storage device 60 further includes a killer area storage unit 392, an additional pattern storage unit 393, and an updating list storage unit 394. The killer area storage unit 392 stores a plurality of killer areas extracted by the killer area searching unit 55. The additional pattern storage unit 393 stores the plurality of additional patterns extracted by the additional pattern searching unit 56. The updating list storage unit 394 stores a ranking list updated by the updating unit 57.

A character pattern extracting method according to the second embodiment will be described below with reference to a flow chart in FIG. 18. Arithmetic operation results obtained by the CPU 50 shown in FIG. 17 are sequentially stored in the temporary storage device 331.

Figure 16:
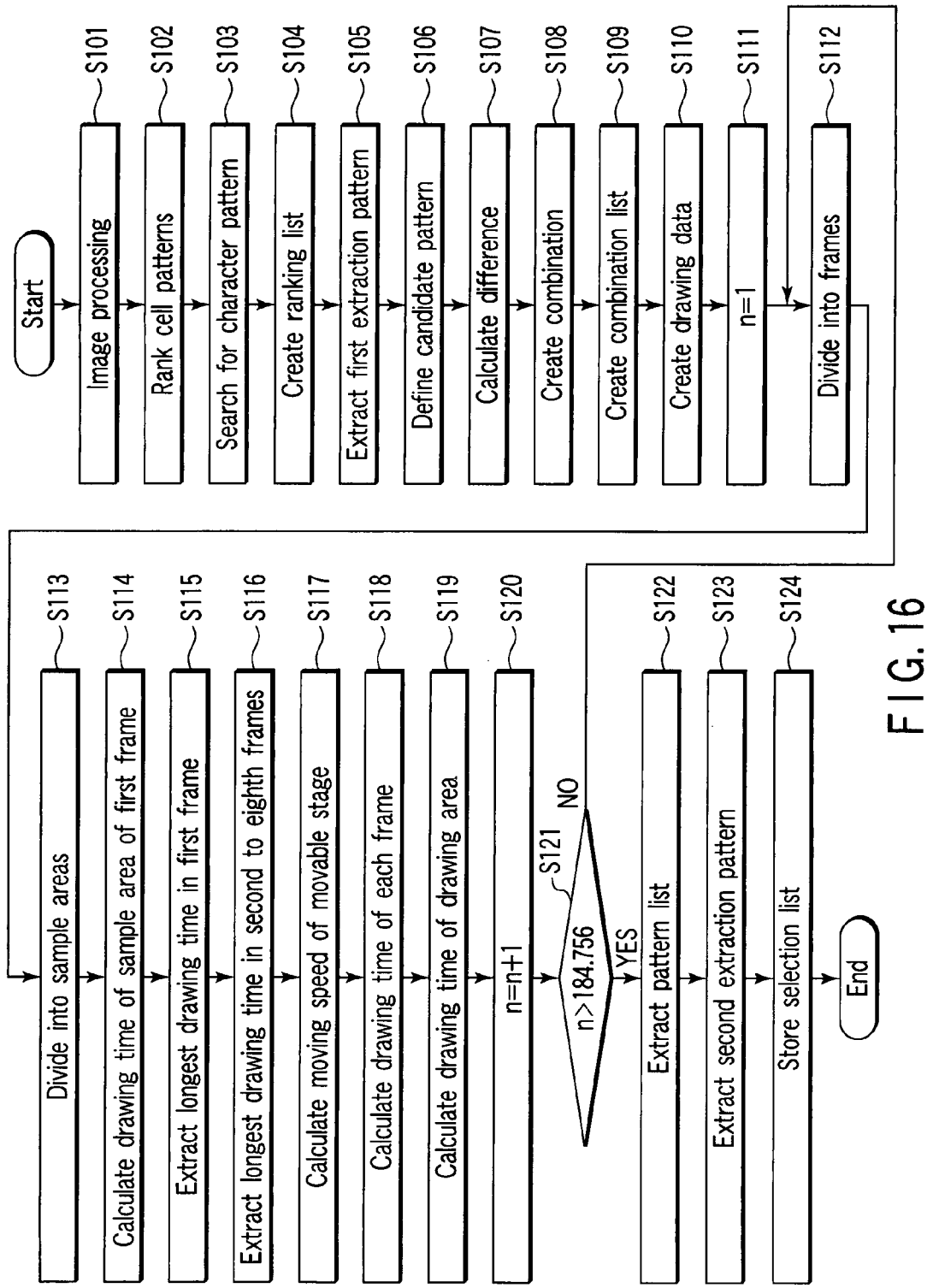
FIG. 16 is a flow chart showing a character pattern extracting method according to the first embodiment of the invention.
Figure 18:
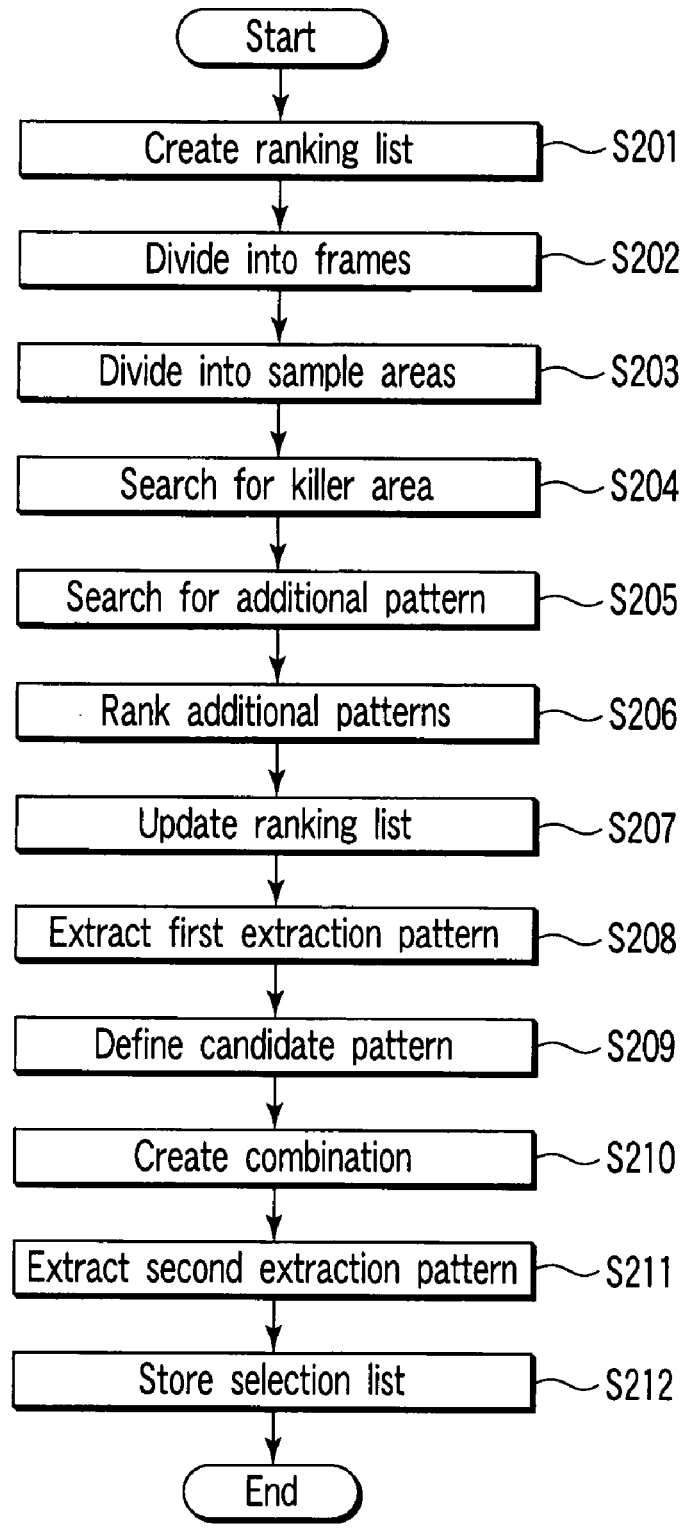
FIG. 18 is a flow chart showing the character pattern extracting method according to the second embodiment of the invention.

(a) By the same method as that in steps S101 to S104 shown in FIG. 16, a ranking list is created in step S201 in FIG. 18. In step S202, the killer area searching unit 55 shown in FIG. 17 divides the drawing area 250 in which a circuit pattern is drawn into the first to eighth frames 201 to 208, as shown in FIG. 6. In step S203, the killer area searching unit 55 shown in FIG. 17 divides the first frame 201 into the first to jth sample areas 221 to 225 in an X direction as shown in FIG. 12. The killer area searching unit 55 shown in FIG. 17 virtually divides each of the second to eighth frames 202 to 208 into first to jth sample areas.

(b) In step S204, the killer area searching unit 55 searches for a first killer area including a maximum number of sub-fields from the first to jth sample areas 221 to 225 of the first frame 201 shown in FIG. 12. The killer area searching unit 55 searches for each of the second to eighth killer areas of the first to eighth frames 201 to 208. The killer area searching unit 55 stores the first to eighth killer areas in the killer area storage unit 392 shown in FIG. 17.

(c) In step S205, the additional pattern searching unit 56 reads the first to eighth killer areas from the killer area storage unit 392. The additional pattern searching unit 56 searches the character database 383 to check whether or not character patterns similar to some of circuit patterns drawn in the first to eighth killer areas are recorded in the character database 383. In step S206, the additional pattern searching unit 56 ranks a plurality of character patterns found by the searching depending on the numbers of times of reference. The additional pattern searching unit 56 extracts, for example, first- to twentieth-ranking character patterns and stores the character patterns in the additional pattern storage unit 393 as a plurality of additional patterns.

(d) In step S207, the updating unit 57 reads a plurality of additional patterns from the additional pattern storage unit 393. The updating unit 57 reads a ranking list from the ranking list storage unit 384. The ranking list has 60 character patterns recorded therein. The updating unit 57 deletes the fifty-first- to sixtieth-ranking character patterns from the ranking list. Thereafter, the updating unit 57 adds 10 first- to tenth-ranking additional patterns to the ranking list to update the ranking list. The updated ranking list has 60 character patterns recorded therein. The updating unit 57 stores the updated ranking list in the updating list storage unit 394.

(e) In step S208, the first extracting unit 52 reads the updated ranking list from the updating list storage unit 394. The first extracting unit 52 sets the number of extracted character patterns to 40 and extracts first- to fortieth-ranking character patterns ranked depending on the numbers of times of reference from the updated ranking list as first extraction patterns. Thereafter, the first extracting unit 52 stores the 40 extracted first extraction patterns in the extraction pattern storage unit 385.

(f) In step S209, the first extracting unit 52 extracts, as candidate patterns, forty-first- to fiftieth-ranking character patterns ranked depending on the numbers of times of reference and ten additional patterns, and stores the patterns in the candidate pattern storage unit 386. In step S210, the combination unit 53 defines combinations as "nth combinations" and stores the combinations in the combination storage unit 387. Thereafter, the same method as that in steps S109 to S123 is used to extract a plurality of second extraction patterns in step S211. By the same method as that in step S124, a selection list is stored in the selection list storage unit 391 in step S212, and the character pattern extracting method according to the second embodiment is ended.

According to the character pattern extracting system and the character pattern extracting method according to the second embodiment described above, character patterns effective to a killer area which limits the moving speed of the movable stage 116 shown in FIG. 2 are added to the ranking list. Therefore, when the CP aperture 108 is manufactured by using a selection list finally selected on the basis of the updated ranking list, the number of shots of the electron beam EB in the killer area is reduced, and the moving speed of the movable stage 116 can be increased. For this reason, time for manufacturing a semiconductor device can be shortened.

When a killer area is drawn while moving the movable stage 116 at a high speed without setting the character patterns effective to the killer area in the CP aperture 108, the position calculating module 23 may be erroneously operated, and shot positions of the electron beam EB are disadvantageously different from each other. In contrast to this, according to the character pattern extracting system and the character pattern extracting method according to the second embodiment, the electron beam EB can be correctly irradiated on a shot position while increasing the moving speed of the movable stage 116.

Third Embodiment

Figure 19:
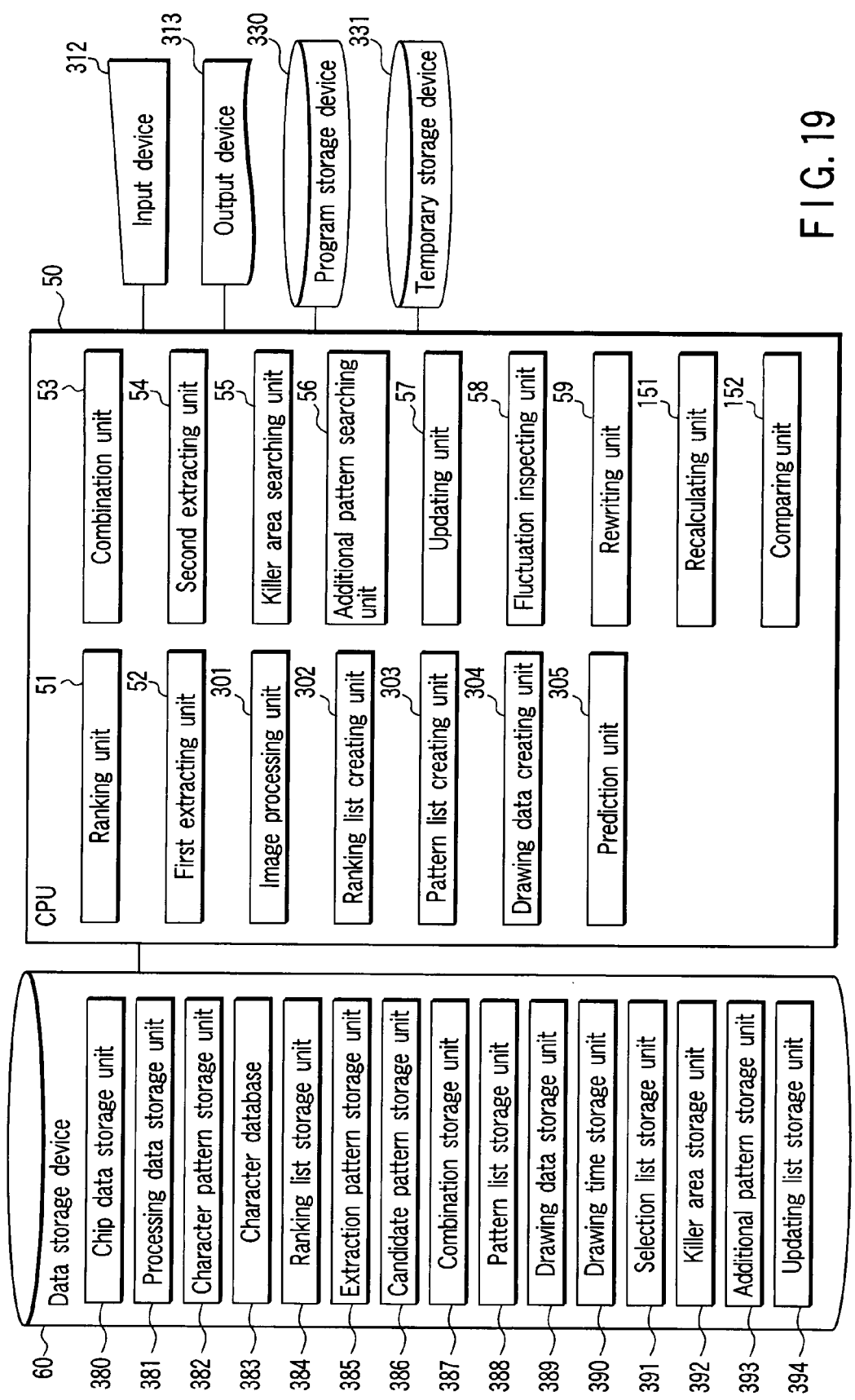
FIG. 19 is a block diagram showing a character pattern extracting system according to a third embodiment of the present invention.
Figure 20:
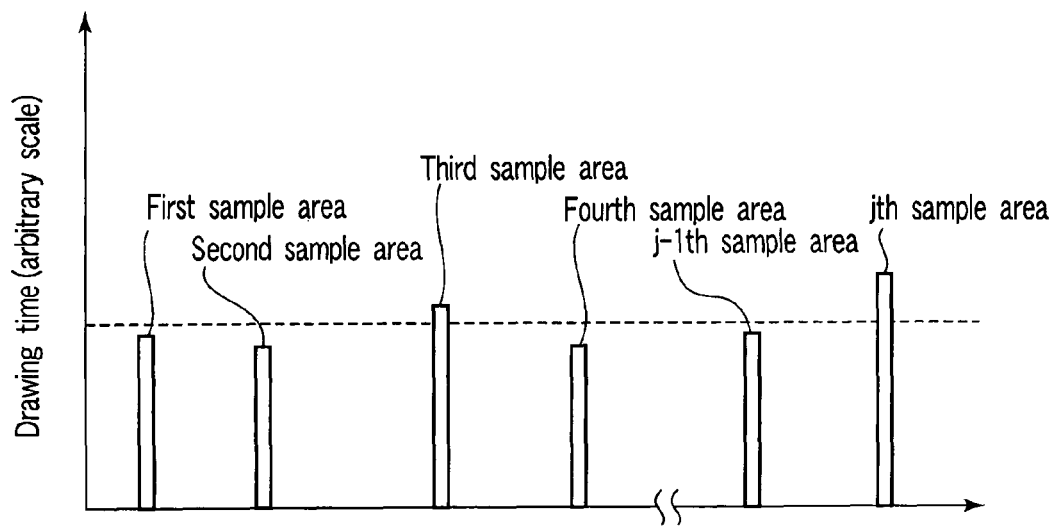
FIG. 20 is a first graph showing drawing time in each sample area according to the third embodiment of the invention.
Figure 21:
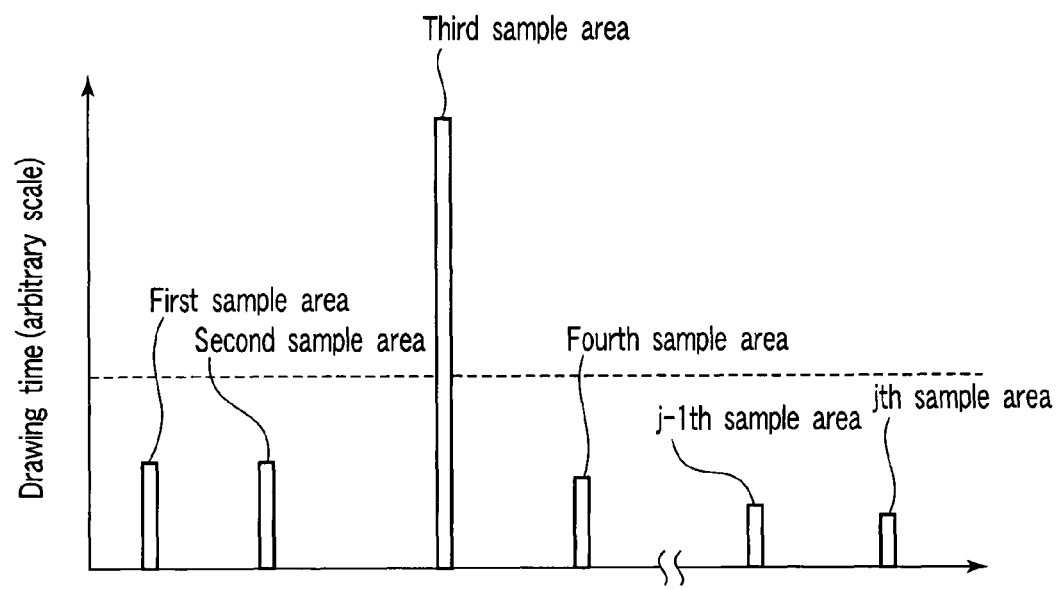
FIG. 21 is a second graph showing drawing time in each sample area according to the third embodiment of the invention.
Figure 22:
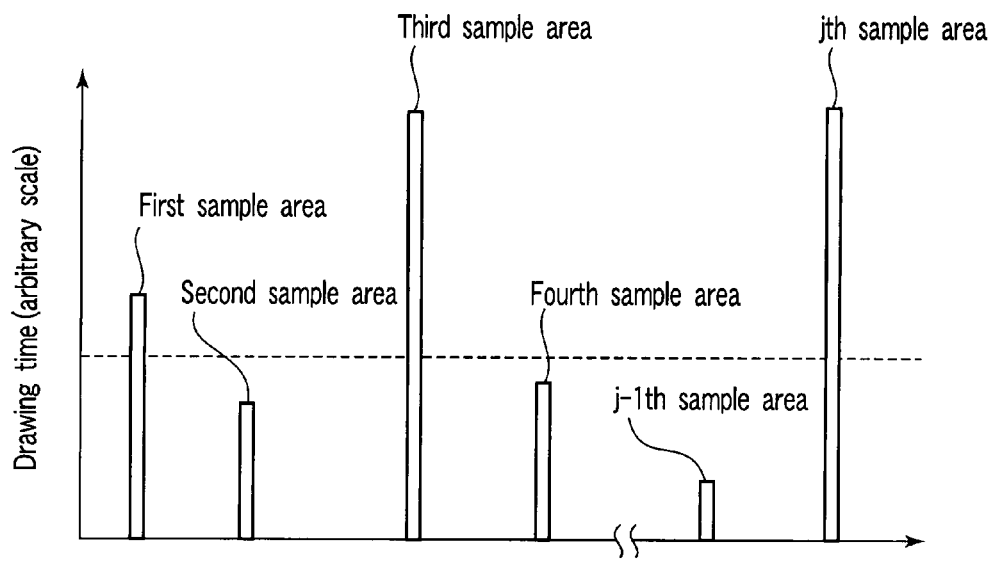
FIG. 22 is a third graph showing drawing time in each sample area according to the third embodiment of the invention.

A character pattern extracting system according to a third embodiment, as shown in FIG. 19, further includes a fluctuation inspecting unit 58, a rewriting unit 59, a recalculating unit 151, and a comparing unit 152. The fluctuation inspecting unit 58 inspects a fluctuation in drawing time of first to jth sample areas when a selection list is used with respect to first to eighth frames 201 to 208 in the drawing area 250 shown in FIG. 6. FIG. 20 shows examples of drawing times of the first to jth sample areas in the first to eighth frames 201 to 208. FIG. 21 shows examples of drawing times of the first to jth sample areas in the first frame 201. FIG. 22 shows examples of drawing times of the first to jth sample areas in the seventh frame 207. A fluctuation in drawing time in the sample areas in the first frame 201 shown in FIG. 21 is larger than that in the eighth frame 208 shown in FIG. 20. A fluctuation in drawing time in the sample areas in the seventh frame 207 shown in FIG. 22 is larger than that in the first frame 201 shown in FIG. 21.

Figure 23:
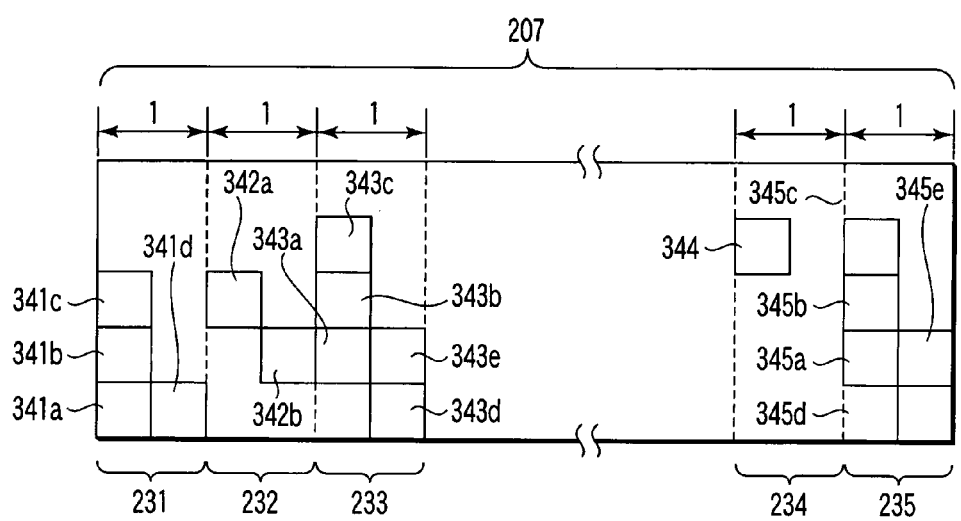
FIG. 23 is a pattern diagram showing a sub-field defined in a frame according to the third embodiment of the invention.

As shown in FIG. 23, four sample fields 341a, 341b, 341c, and 341d are defined in a first sample area 231 of the seventh frame 207. Two sub-fields 342a and 342b are defined in a second sample area 232. Five sub-fields 343a, 343b, 343c, 343d, and 343e are defined in a third sample area 233. One sub-field 344 is defined in a j−1th sample area 234. In a jth sample area 235, five sub-field 345a, 345b, 345c, 345d, and 345e are defined. As shown in FIG. 22, drawing time of the third sample area 233 in which the five sub-fields 343a to 345e are defined and drawing time of the jth sample area 235 in which the five sub-field 345a to 345e are defined, is longer than that of another sample area. On the other hand, drawing time of the j−1th sample area 234 in which one sub-field 344 is defined is shorter than that in another sample area.

Figure 24:
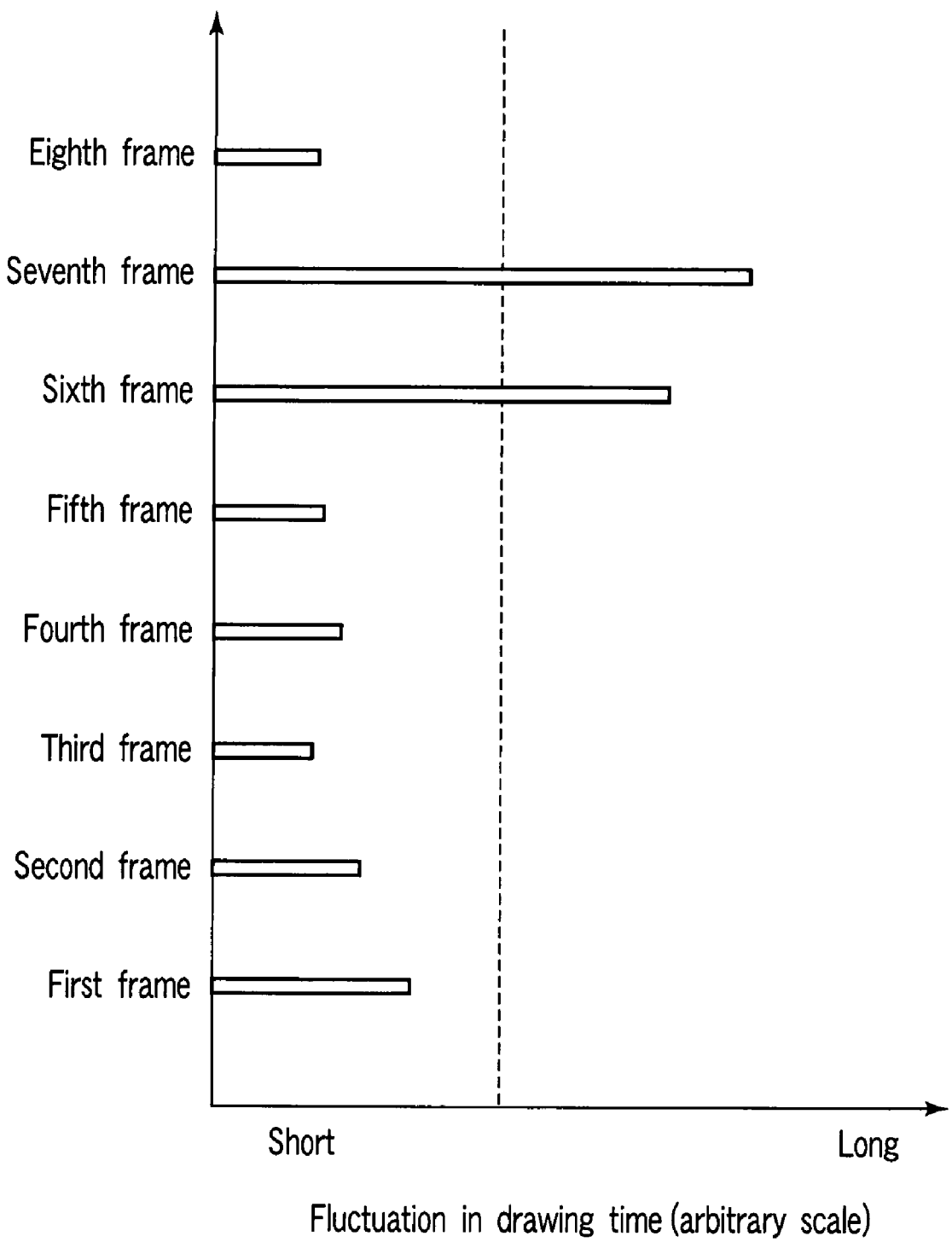
FIG. 24 is a graph showing a fluctuation in drawing time according to the third embodiment of the invention.

The fluctuation inspecting unit 58, as shown in FIG. 24, evaluates fluctuations in drawing time in the first to jth sample areas with respect to the first to eighth frames 201 to 208. Furthermore, the fluctuation inspecting unit 58 shown in FIG. 19 ranks the first to seventh frames 201 to 207 depending on the fluctuations in drawing time. For example, the seventh frame 207 is defined as a first-ranking frame, the sixth frame 206 is defined as a second-ranking frame, the first frame 201 is defined as a third-ranking frame, the second frame 202 is defined as a fourth-ranking frame, the fourth frame 204 is defined as a fifth-ranking frame, the eighth frame 208 is defined as a sixth-ranking frame, the fifth frame 205 is defined as a seventh-ranking frame, and the third frame 203 is defined as an eighth-ranking frame.

The rewriting unit 59 extracts, as a plurality of examination patterns for the mth-ranking frame, a plurality of character patterns which can be used in drawing an mth-ranking frame ranked depending on the fluctuation in drawing time, from the plurality of character patterns recorded in the selection list. Reference symbol "m" is a natural number selected from 1 to 8. The rewriting unit 59 creates an examination list for the mth-ranking frame in which the plurality of extracted mth-ranking examination patterns are recorded.

The rewriting unit 59 extracts a plurality of character patterns which can be used in drawing of a killer area which maximally limits the moving speed of the movable stage 116 shown in FIG. 2 in the first to jth sample areas included in the mth-ranking frame ranked depending on the fluctuations in drawing time, from the character database 383 shown in FIG. 19 as a plurality of limitation canceling patterns for the mth-ranking frame. Alternatively, the rewriting unit 59 may create a plurality of limitation canceling patterns for the mth-ranking frame. Furthermore, the rewriting unit 59 ranks the plurality of extracted or created limitation canceling patterns for the mth-ranking frame depending on the numbers of times of reference. The ranking is also performed depending on values obtained by products between the numbers of times of reference and the number of graphics required if character patterns are drawn by VSB. The rewriting unit 59 creates a limitation canceling list for the mth-ranking frame in which a plurality of ranked limitation canceling patterns for the mth-ranking frame are recorded. The rewriting unit 59 extracts a plurality of character patterns which can be used in drawing sample areas of the mth-ranking frame except for a killer area from the examination list for the mth-ranking frame as a plurality of limitation uncanceling patterns for the mth-ranking frame.

Furthermore, the rewriting unit 59 ranks the plurality of extracted limitation uncanceling patterns for the mth-ranking frame depending on the numbers of times of reference. The ranking is also performed depending on values obtained by products between the numbers of times of reference and the number of graphics required if character patterns are drawn by VSB. The rewriting unit 59 creates a limitation uncanceling list for the mth-ranking frame in which a plurality of ranked limitation uncanceling patterns for the mth-ranking frame are recorded.

The rewriting unit 59 deletes, from the examination list for the mth-ranking frame, a character pattern which has a small number of times of reference and is not used in drawing of a killer area in the plurality of limitation uncanceling patterns for the mth-ranking frame recorded in the limitation uncanceling list for the mth-ranking frame. The rewriting unit 59 adds a character pattern which has a large number of times of reference and is not recorded in the examination list for the mth-ranking frame out of the plurality of limitation canceling patterns for the mth-ranking frame recorded in the limitation canceling list for the mth-ranking frame, to the examination list for the mth-ranking frame to create a rewriting list for the mth-ranking frame.

The recalculating unit 151 calculates drawing time of a killer area of the mth-ranking frame when the plurality of character patterns recorded in the rewriting list for the mth-ranking frame are used. With respect to a part which can be drawn by the plurality of deleted limitation uncanceling patterns for the mth-ranking frame, drawing time using the VSB scheme is calculated. The recalculating unit 151 calculates a moving speed of the movable stage 116 which can be set when the mth-ranking frame ranked depending on the fluctuations in drawing time is drawn and drawing time of the mth-ranking frame on the basis of drawing time of a killer area of the mth-ranking frame.

The comparing unit 152 compares drawing time of the mth-ranking frame when the examination list for the mth-ranking frame is used with drawing time of the mth-ranking frame when the rewriting list for the mth-ranking frame is used. In the case where the drawing time required when the rewriting list for the mth-ranking frame is used shorter than the drawing time required when the examination list for the mth-ranking frame is used, the comparing unit 152 deletes a plurality of character patterns recorded in the examination list for the mth-ranking frame from the selection list. Furthermore, the comparing unit 152 adds the character patterns recorded in the rewriting list for the mth-ranking frame to the selection list. In the case where the drawing time required when the examination list for the mth-ranking frame is used is shorter than the drawing time required when the rewriting list for the mth-ranking frame is used, the comparing unit 152 does not change the selection list.

The rewriting unit 59, the recalculating unit 151, and the comparing unit 152 have internal counters "m", respectively. The reference symbol "m" is a natural number. The initial value of the internal counter "m" is 1. Each of the rewriting unit 59, the recalculating unit 151, and the comparing unit 152 adds 1 to the value of the internal counter "m". The adding operation is performed each time the comparing unit 152 ends the comparison of the drawing time required when the examination list for the mth-ranking list is used with the drawing time required when the mth-ranking rewriting list is used. The rewriting unit 59, the recalculating unit 151, and the comparing unit 152 end their operations when the values of the internal counters "m" are larger than a value obtained by adding 1 to the number of frames.

A character pattern extracting method according to the third embodiment will be described below with reference to a flow chart shown in FIG. 25. Arithmetic operation results obtained by the CPU 50 shown in FIG. 19 are sequentially stored in the temporary storage device 331.

Figure 25:
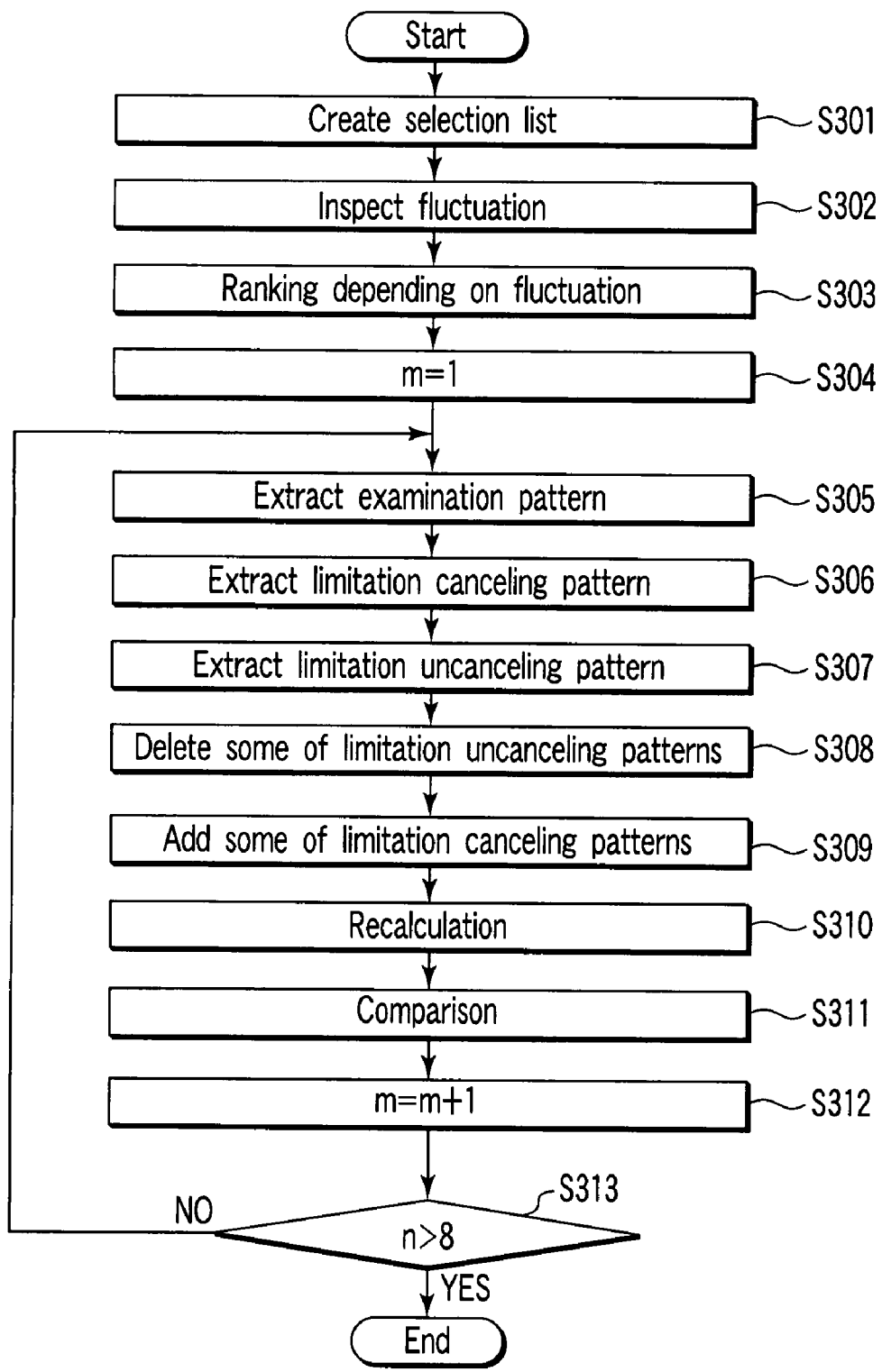
FIG. 25 is a flow chart showing a character pattern extracting method according to the third embodiment of the invention.

(a) The same method as that in steps S101 to S104 shown in FIG. 16 is used to create a selection list in step S301 in FIG. 25. In step S302, the fluctuation inspecting unit 58 shown in FIG. 19 inspects fluctuations in drawing time of the first to jth sample areas in the first to eighth frames 201 to 208 shown in FIG. 6 when the selection list is used. In step S303, the fluctuation inspecting unit 58 shown in FIG. 19 ranks the first to eighth frames 201 to 208 depending on magnitudes of the fluctuations.

(b) In step S304, the rewriting unit 59, the recalculating unit 151, and the comparing unit 152 set 1 as the values of the internal counters "m", respectively. In step S305, the rewriting unit 59 extracts, from the selection list, a plurality of examination patterns for an mth-ranking frame which can be used in drawing of the mth-ranking frame ranked depending on the fluctuations in drawing time. Then, the rewriting unit 59 creates an examination list for the mth-ranking frame in which the plurality of examination patterns for the mth-ranking frame are recorded.

(c) In step S306, the rewriting unit 59 extracts, from the character database 383, a plurality of limitation canceling patterns for the mth-ranking frame which can be used in drawing a killer area of the mth-raking frame to rank the patterns depending on the numbers of times of reference. The rewriting unit 59 then creates a limitation canceling list for the mth-ranking frame in which the plurality of ranked limitation canceling patterns for the mth-ranking frame are recorded.

(d) In step S307, the rewriting unit 59 extracts, from the mth-ranking examination list, a plurality of limitation uncanceling patterns which can be used in sample drawing except for the killer area of the mth-ranking frame to rank the patterns depending on the numbers of times of reference. The rewriting unit 59 creates a limitation uncanceling list for the mth-ranking frame in which the plurality of ranked limitation uncanceling patterns for the mth-raking frame are recorded.

(e) In step S308, the rewriting unit 59 deletes, from the examination list for the mth-ranking frame, a character pattern which has a small number of times of reference and is not used in drawing of the killer area in the plurality of limitation uncanceling patterns for the mth-ranking frame. The rewriting unit 59 adds to the examination list for the mth-ranking frame a character pattern which has a large number of times of reference and is not recorded in the examination list for the mth-ranking frame to create a rewriting list for the mth-ranking frame.

(f) In step S310, the recalculating unit 151 calculates drawing time of a killer area of the mth-ranking frame when the rewriting list for the mth-ranking frame is used. The recalculating unit 151 calculates drawing time of the mth-raking frame when the rewriting list for the mth-ranking frame is used on the basis of the drawing time of the killer area of the mth-ranking frame.

(g) In step S311, the comparing unit 152 compares drawing time required when the examination list for the mth-ranking frame is used with drawing time required when the rewriting list for the mth-ranking frame is used. When the drawing time required when the rewriting list for the mth-ranking frame is used shorter than the drawing time for the mth-ranking frame when the examination list for the mth-ranking frame is used, the comparing unit 152 deletes a plurality of character patterns recorded in the examination list for the mth-ranking frame from the selection list, and the comparing unit 152 adds the character patterns recorded in the rewriting list for the mth-ranking frame to the selection list. When the drawing time required when the examination list for the mth-ranking frame is used is shorter than the drawing time required when the rewriting list for the mth-ranking frame is used, the comparing unit 152 does not change the selection list.

(h) In step S312, the rewriting unit 59, the recalculating unit 151, and the comparing unit 152 add 1 to the values of the internal counters "m". When the value of the internal counter "m" is equal to or less than 8 in step S313, the operation returns to step S305. When the value of the internal counter "m" is larger than 8 in step S313, the character pattern extracting method according to the third embodiment is ended.

According to the character pattern extracting system and the character pattern extracting method according to the third embodiment, some of a plurality of character patterns recorded in the selection list can be rewritten with character patterns effective to a killer area. This makes it shorten drawing time in the respective killer areas in the first to eighth frames 201 to 208, and accordingly, a semiconductor device can be manufactured at a higher speed.

As mentioned above, the embodiments of the present invention are described. However, the present invention is not limited to the embodiments. For example, in the second embodiment, an area including the maximum number of sub-fields is extracted as a killer area. However, an area which is predicted to have the maximum number of shots may be extracted as a killer area. The character pattern extracting method described above can be expressed as a series of processes or operations which are serially connected. Therefore, in order to realize the character pattern extracting method by the CPU 50 shown in FIG. 1, the character pattern extracting method shown in FIG. 16 can be realized by a computer program product which specifies a plurality of functions achieved by a processor or the like in the CPU 50. In this case, the computer program product means a recording medium, a recording device, or the like which enables data input and output to and from the CPU 50. The recording medium includes a memory device, a magnetic disk device, an optical disk device, and other devices which can record programs.

Figure 26:
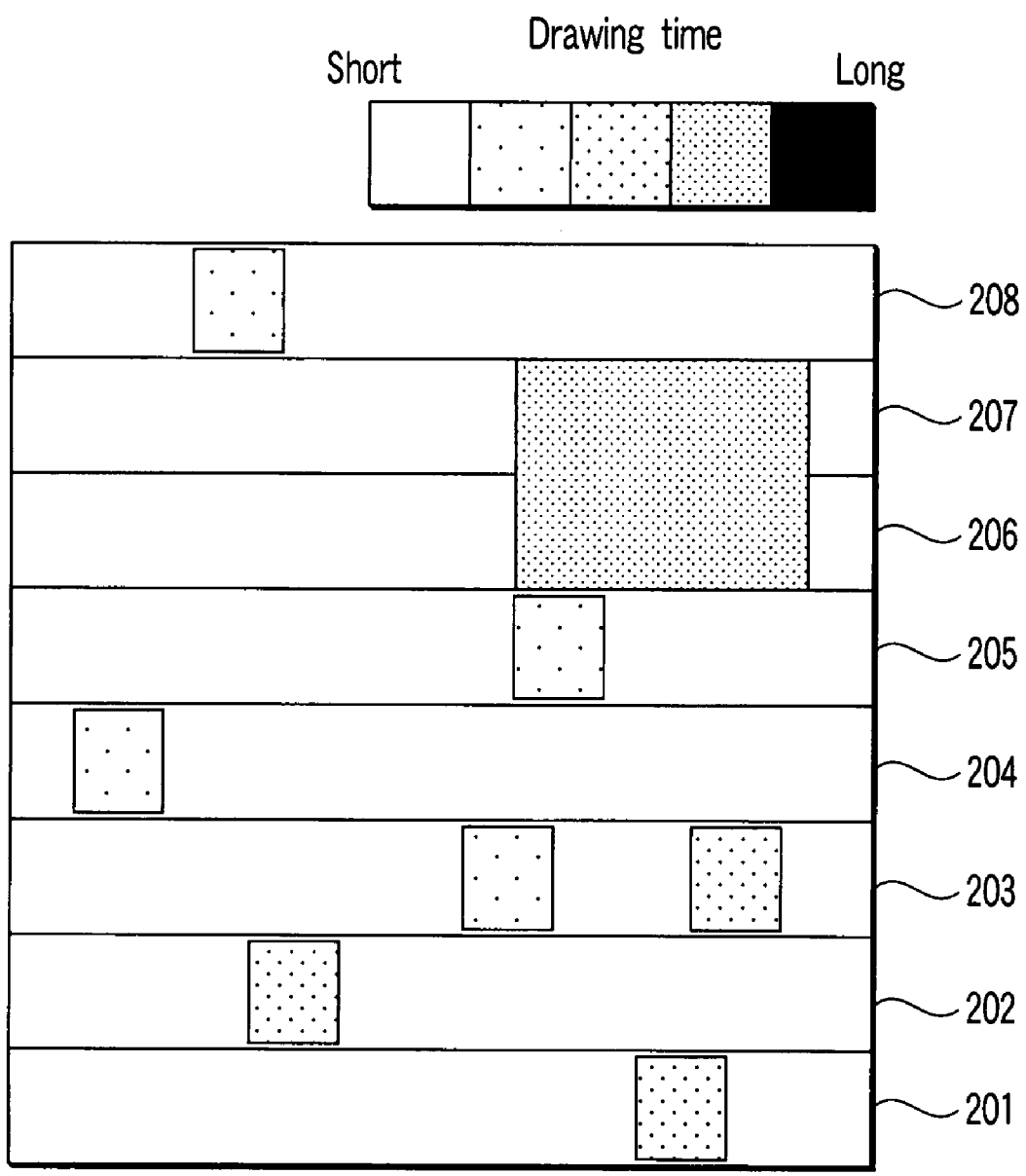
FIG. 26 is a pattern diagram showing an exemplary display of a frame according to another embodiment of the present invention.

In step S204 in FIG. 18, first to eighth killer areas of the first to eighth frames 201 to 208 may be displayed by the output device 313 shown in FIG. 17. FIG. 26 shows an example in which the first to eighth killer areas are displayed with different brightnesses depending on predicted drawing times. The killer areas may be displayed in different colors. The first to eighth killer areas may be displayed with different brightnesses or in different colors depending on the numbers of shots. Furthermore, there can be displayed predicted moving speeds of the movable stage 116 when some of circuit patterns are drawn in the first to eighth frames 201 to 208 or predicted drawing times of the first to eighth frames 201 to 208. In steps S205 and S206, an operator may be prompted through the display on the output device 313 shown in FIG. 17 to input a plurality of additional patterns, so that the plurality of additional patterns input from the input device 312 may be stored in the additional pattern storage unit 393. When in step S207, an operator selects the first to eighth killer areas displayed on the output device 313 as shown in FIG. 26, a lower-ranking character pattern included in a ranking list may be displayed on the output device 313. Thereafter, the operator may select a lower-ranking character pattern displayed on the output device 313 to delete the character pattern from the ranking list.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A character pattern extracting method comprising:
ranking character patterns the number of which is larger than a maximum number of character patterns which are formed in an aperture by a ranking unit depending on the number of times of reference in design data of a semiconductor device to store the character patterns in a ranking storage unit;
reading the larger number of character patterns from the ranking storage unit and extracting a plurality of first extraction patterns the number of which is smaller than the maximum number by a first extracting unit from the large number of read character patterns in a descending order of the number of times of reference;
defining a plurality of character patterns except the first extraction patterns out of the large number of character patterns by the first extracting unit as candidate patterns to store the candidate patterns in a candidate storage unit;
reading the plurality of candidate patterns from the candidate storage unit, selecting from the read candidate patterns a plurality of candidate patterns the number of which corresponds to a difference obtained by subtracting the number of extracted patterns from the maximum number, and creating a plurality of combinations of the plurality of selected candidate patterns by a combination unit to store the combinations of the plurality of selected candidate patterns in a combination storage unit; and
reading the plurality of combinations of selected candidate patterns from the combination storage unit and extracting a plurality of second extraction patterns included in a combination among the plurality of combinations of selected candidate patterns by a second extracting unit, in which a manufacturing time of the semiconductor device is most shortened.

2. The character pattern extracting method according to claim 1, further comprising:
dividing a drawing area in which the semiconductor device is manufactured into a plurality of frames;
dividing each of the plurality of frames into a plurality of sample areas;
calculating a sample area drawing time of each of the plurality of sample areas of each of the plurality of frames when the plurality of combinations of candidate patterns are used;
dividing a width of a sample area having a longest sample area drawing time out of the plurality of sample areas of each of the plurality of frames by the longest sample area drawing time to calculate moving speeds of the plurality of frames;
dividing a width of each of the plurality of frames by corresponding one of the moving speeds to calculate frame drawing time of each of the plurality of frames; and
calculating a total time of the frame drawing times of the plurality of frames.

3. The character pattern extracting method according to claim 2, further comprising:
ending the calculation of the total time when a count value of a counter the value of which is incremented by 1 each time the total time is calculated is larger than the number of the combinations of selected candidate patterns;

extracting a plurality of pattern lists including a candidate pattern included in the first extraction pattern and the plurality of combinations of selected candidate patterns;

extracting, as the second extraction patterns, a plurality of candidate patterns included in a pattern list which gives a shortest drawing time out of the plurality of extracted pattern lists; and storing, as a selection list, the plurality of candidate patterns extracted as the second extraction patterns.

4. The character pattern extracting method according to claim 3, comprising:

inspecting fluctuations in area drawing time of a plurality of sample areas of each of the plurality of frames when the selection list is used;

ranking the plurality of frames on the basis of the fluctuations in sample area drawing time of the plurality of frames;

extracting a plurality of character patterns which are usable in drawing of an mth-ranking frame ranked depending on the fluctuations in drawing time out of the plurality of character patterns recorded in the selection list as a plurality of examination patterns for the mth-ranking frame ("m" is the number of frames, a natural number);

creating an examination list for the mth-ranking frame in which the plurality of extracted examination patterns for the mth-ranking frame are recorded;

extracting a plurality of character patterns which are usable in drawing of a limiting area which substantially limits a moving speed of a movable stage of a semiconductor wafer in first to jth sample areas ("j" is a natural number) included in the mth-ranking frame ranked depending on the fluctuations in drawing time, from a character database as a plurality of limitation canceling patterns for the mth-ranking frame;

ranking the plurality of extracted limitation canceling patterns for the mth-ranking frame depending on the numbers of times of reference;

creating a limitation canceling list for the mth-ranking frame in which the plurality of ranked limitation canceling patterns for the mth-ranking frame are recorded;

extracting a plurality of character patterns which are usable in drawing of sample areas of the mth-ranking frame except for the limiting area, from the examination list for the mth-ranking frame as a plurality of limitation uncanceling patterns for the mth-ranking frame;

ranking the plurality of extracted limitation uncanceling patterns depending on the numbers of times of reference;

creating a limitation uncanceling list for the mth-ranking frame in which the plurality of ranked limitation uncanceling patterns for the mth-ranking frame are recorded;

deleting a character pattern which substantially has a small number of times of reference and is not used in drawing of the limiting area out of the plurality of limitation uncanceling patterns for the mth-ranking frame recorded in the limitation uncanceling list for the mth-ranking frame, from the examination list for the mth-ranking frame, and adding a character pattern which substantially has a large number of times of reference and is not recorded in the examination list for the mth-ranking frame out of the plurality of limitation uncanceling patterns for the mth-ranking frame recorded in the limitation uncanceling list for the mth-ranking frame, to the examination list for the mth-ranking frame to create a rewriting list for the mth-ranking frame;

calculating a drawing time of the limiting area of the mth-ranking frame when the plurality of character patterns recorded in the rewriting list for the mth-ranking frame are used;

calculating a movable stage moving speed which is set when the mth-ranking frame ranked depending on the fluctuations in drawing time is drawn and drawing time of the mth-ranking frame on the basis of the drawing time of the limiting area of the mth-ranking frame;

comparing the drawing time of the mth-ranking frame when the examination list for the mth-ranking frame is used with the drawing time of the mth-ranking frame when the rewriting list for the mth-ranking frame is used, and as a result, when the drawing time required when the rewriting list for the mth-ranking frame is used is shorter than the drawing time required when the examination list for the mth-ranking frame is used, deleting the plurality of character patterns recorded in the examination list for the mth-ranking frame from the selection list and adding the plurality of character patterns recorded in the rewriting list for the mth-ranking frame to the selection list, and when the drawing time required when the examination list for the mth-ranking frame is used is shorter than the drawing time required when the rewriting list for the mth-ranking frame is used, unchanging the selection list.

5. The character pattern extracting method according to claim 4, comprising:

using a counter the initial value of which is set at 1, incrementing a counter value by 1 each time comparison between the drawing time required when the examination list for the mth-ranking frame is used and the drawing time required when the rewriting list for the mth-ranking frame is used is ended, and ending an operation when the counter value is larger than a value obtained by adding 1 to the number of frames.

6. The character pattern extracting method according to claim 2, further comprising:

causing the operation to return to a step of dividing a drawing area into a plurality of frames when a count value of a counter the value of which is incremented by 1 each time the total time is calculated is smaller than the number of the combinations of selected candidate patterns.

7. The character pattern extracting method according to claim 1, further comprising:

including, in the plurality of candidate patterns, an additional pattern similar to some of a plurality of circuit patterns included in an area in which a density of circuit patterns of the semiconductor device is high.

8. The character pattern extracting method according to claim 7, further comprising:

ranking the plurality of additional patterns depending on the number of times of reference.

9. The character pattern extracting method according to claim 8, further comprising:

updating ranking of the plurality of candidate patterns including the additional patterns.

10. The character pattern extracting method according to claim 7, further comprising:

ranking the plurality of additional patterns depending on products between the number of times of reference and the number of graphics required when character patterns are drawn.

11. A charged particle beam drawing method comprising:

ranking character patterns the number of which is larger than a maximum number of character patterns which are formed in an aperture depending on the number of times of reference in design data of a semiconductor device;

extracting a plurality of first extraction patterns the number of which is smaller than the maximum number from the larger number of character patterns in a descending order of the number of times of reference;

defining a plurality of character patterns except the first extraction patterns out of the larger number of character patterns as candidate patterns;

selecting from the plurality of candidate patterns a plurality of candidate patterns the number of which corresponds to a difference obtained by subtracting the number of extracted patterns from the maximum number, and creating a plurality of combinations of the plurality of selected candidate patterns;

extracting a plurality of second extraction patterns included in a combination among the plurality of combinations of the selected candidate patterns, in which a manufacturing time of the semiconductor device is most shortened;

manufacturing an aperture having the first extraction patterns and the second extraction patterns; and irradiating a charged particle beam on a resist film by using the aperture.

12. The charged particle beam drawing method according to claim 11, further comprising:

dividing a drawing area in which the semiconductor device is manufactured into a plurality of frames;

dividing each of the plurality of frames into a plurality of sample areas;

calculating sample area drawing time of each of the plurality of sample areas of each of the plurality of frames when the plurality of combinations of candidate patterns are used;

dividing a width of a sample area having a longest sample area drawing time out of the plurality of sample areas of each of the plurality of frames by the longest sample area drawing time to calculate moving speeds of the plurality of frames;

dividing a width of each of the plurality of frames by corresponding one of the moving speeds to calculate frame drawing time of each of the plurality of frames; and calculating a total time of the frame drawing times of the plurality of frames.

13. The charged particle beam drawing method according to claim 12, further comprising:

ending the calculation of the total time when a count value of a counter the value of which is incremented by 1 each time the total time is calculated is larger than the number of the combinations of the selected candidate patterns;

extracting a plurality of pattern lists including a candidate pattern included in the first extraction pattern and the plurality of combinations of selected candidate patterns;

extracting, as the second extraction patterns, a plurality of candidate patterns included in a pattern list which gives a shortest drawing time out of the plurality of extracted pattern lists; and storing, as a selection list, the plurality of candidate patterns extracted as the second extraction patterns.

14. The charged particle beam drawing method according to claim 12, further comprising:

causing the operation to return to a step of dividing a drawing area into a plurality of frames when a count value of a counter the value of which is incremented by 1 each time the total time is calculated is smaller than the number of the combinations of selected candidate patterns.

15. The charged particle beam drawing method according to claim 11, further comprising:

including, in the plurality of candidate patterns, an additional pattern similar to some of a plurality of circuit patterns included in an area in which a density of circuit patterns of the semiconductor device is high.

16. A non-transitory computer readable medium encoded thereon a character pattern extracting program which causes the computer to execute:

ranking character patterns the number of which is larger than a maximum number of character patterns which are formed in an aperture depending on the number of times of reference in design data of a semiconductor device; extracting a plurality of first extraction patterns the number of which is smaller than the maximum number from the larger number of character patterns in a descending order of the number of times of reference; defining a plurality of character patterns except the first extraction patterns out of the larger number of character patterns as candidate patterns; selecting from the plurality of candidate patterns a plurality of candidate patterns the number of which corresponds to a difference obtained by subtracting the number of extracted patterns from the maximum number, and creating a plurality of combinations of the plurality of selected candidate patterns; and extracting a plurality of second extraction patterns included in a combination among the plurality of combinations of the selected candidate pattern, in which a manufacturing time of the semiconductor device is most shortened.

17. The character pattern extracting program according to claim 16, which causes the computer to further execute:

dividing a drawing area in which the semiconductor device is manufactured into a plurality of frames;

dividing each of the plurality of frames into a plurality of sample areas;

calculating a sample area drawing time of each of the plurality of sample areas of each of the plurality of frames when the plurality of combinations of candidate patterns are used;

dividing a width of a sample area having a longest sample area drawing time out of the plurality of sample areas of each of the plurality of frames by the longest sample area drawing time to calculate moving speeds of the plurality of frames;

dividing a width of each of the plurality of frames by corresponding one of the moving speeds to calculate a frame drawing time of each of the plurality of frames; and calculating a total time of the frame drawing times of the plurality of frames.

18. The character pattern extracting program according to claim 17, which causes the computer to further execute:

ending the calculation of the total time when a count value of a counter the value of which is incremented by 1 each time the total time is calculated is larger than the number of the combinations of the selected candidate patterns;

extracting a plurality of pattern lists including a candidate pattern included in the first extraction pattern and the plurality of combinations of candidate patterns;

extracting, as the second extraction patterns, a plurality of candidate patterns included in a pattern list which gives a shortest drawing time out of the plurality of extracted pattern lists; and storing, as a selection list, the plurality of candidate patterns extracted as the second extraction patterns.

19. The character pattern extracting program according to claim 17, which causes the computer to further execute:

causing the operation to return to a step of dividing a drawing area into a plurality of frames when a count value of a counter the value of which is incremented by 1 each time the total time is calculated is smaller than the number of the combinations.

20. The character pattern extracting program according to claim 16, which causes the computer to further execute:

including, in the plurality of candidate patterns, an additional pattern similar to some of a plurality of circuit patterns included in an area in which a density of circuit patterns of the semiconductor device is high.

* * * * *